(12) United States Patent
Gracias et al.

(10) Patent No.: US 9,375,873 B2
(45) Date of Patent: Jun. 28, 2016

(54) CURVED AND FLEXIBLE MICROFLUIDICS

(75) Inventors: David H. Gracias, Baltimore, MD (US); Mustapha Jamal, Clarksville, MD (US)

(73) Assignee: The Johns Hopkins University, Baltimore, MD (US)

(*) Notice: Subject to any disclaimer, the term of this patent is extended or adjusted under 35 U.S.C. 154(b) by 176 days.

(21) Appl. No.: 13/880,321

(22) PCT Filed: Oct. 25, 2011

(86) PCT No.: PCT/US2011/057696
§ 371 (c)(1),
(2), (4) Date: Apr. 18, 2013

(87) PCT Pub. No.: WO2012/061138
PCT Pub. Date: May 10, 2012

(65) Prior Publication Data
US 2013/0210148 A1    Aug. 15, 2013

Related U.S. Application Data

(60) Provisional application No. 61/406,346, filed on Oct. 25, 2010.

(51) Int. Cl.
| | |
|---|---|
| *C12N 5/00* | (2006.01) |
| *B29C 59/16* | (2006.01) |
| *B01L 3/00* | (2006.01) |
| *B81C 1/00* | (2006.01) |
| *C08J 3/24* | (2006.01) |
| *B29C 59/00* | (2006.01) |
| *H01Q 1/38* | (2006.01) |

(52) U.S. Cl.
CPC ........... *B29C 59/16* (2013.01); *B01L 3/502707* (2013.01); *B29C 59/005* (2013.01); *B81C 1/00007* (2013.01); *C08J 3/245* (2013.01); *H01Q 1/38* (2013.01); *B01L 2200/10* (2013.01); *B01L 2200/12* (2013.01); *B01L 2300/123* (2013.01); *Y10T 428/24628* (2015.01); *Y10T 428/24802* (2015.01)

(58) Field of Classification Search
CPC ....................................................... C12N 5/00
See application file for complete search history.

(56) References Cited

PUBLICATIONS

Sameoto et al. (Control of the out-of-plane curvature in SU-8 compliant microstructures by exposure dose and baking times. J. Micromech. Microeng. 17 (2007) 1092-1098).*
Jamal et al. (Directed growth of fibroblasts into three dimensional micropatterned geometries via self-assembling scaffolds. Biomaterials 31 1683-1690. Available online Dec. 17, 2009).*
Biswas et al. (A Study of Electrical and Optical properties of Photoresist S1800. Lund University, 2013, pp. 1-9).*
Bowden, N., Brittain, S., Evans, A. G., Hutchinson, J. W., and Whitesides, G. M. Spontaneous formation of ordered structures in thin films of metals supported on an elastomeric polymer. Nature 393, 146-149 (1998).
Mahadevan, L. and Rica, S. Self-organized origami. Science 307, 1740 (2005).
Jamal, M., Bassik, N., Cho, J.-H., Randall, C. L., and Gracias, D. H. Directed growth of fibroblasts into three dimensional micropatterned geometries via self-assembling scaffolds. Biomaterials 31, 1683-1690 (2010).
Bates, F. S. and Fredrickson, G. H. Block copolymers-designer soft materials. Phys. Today 52, 32-38 (1999).
Harris, K. D., Bastiaansen, C. W. M., and Broer, D. J. A glassy bending-mode polymeric actuator which deforms in response to solvent polarity. Macrornol. Rapid Cornrn. 27, 1323-1329 (2006).
Klein, Y., Efrati, E., and Sharon, E. Shaping of elastic sheets by prescription of non-Euclidean metrics. Science 315, 1116-1120 (2007).
Guan, J., He, H., Hansford, D. J., and Lee, L. J. Self-folding of three-dimensional hydrogel microstructures. J. Phys. Chern. B 109, 23134-23137 (2005).
Azam, A., Laflin, K. E., Jamal, M., Fernandes, R., and Gracias, D. H. Self-folding micropatterned polymeric containers. Biorned Microdevices 13, 51-58 (2011).
Jeong, K.-U., et al. Three-dimensional actuators transformed from the programmed two dimensional structures via bending, twisting and folding mechanisms. J. Mater. Chem 21, 6824-6830 (2011).
Stoychev, G., Puretskiy, N., and Ionov, L. Self-folding all-polymer thermoresponsive microcapsules. Soft Matter 7, 3277-3279 (2011).
Borenstein, J. T., et al. Microfabrication technology for vascularized tissue engineering. Biorned Microdevices 4, 167-175 (2002).
Andersson, H. and van den Berg, A. Microfabrication and micro fluidics for tissue engineering: state of the art and future opportunities. Lab Chip 4, 98-103 (2004).
Kelm, J. M., etal. Design of custom-shaped vascularized tissues using microtissue spheroids as minimal building units. Tissue Eng. 12, 2151-2160 (2006).
McGuigan, A. P. and Sefton, M. V. Vascularized organoid engineered by modular assembly enables blood perfusion. Proc. Natl Acad Sci. USA 103, 11461-11466 (2006).
Griffith, L. G. and Swartz, M. A. Capturing complex 3D tissue physiology in vitro. Nat. Rev. Mol. Cell Bioi. 7, 211-224 (2006).

(Continued)

*Primary Examiner* — Karen Cochrane Carlson
*Assistant Examiner* — Natalie Moss
(74) *Attorney, Agent, or Firm* — Venable LLP; Henry J. Daley; F. Brock Riggs

(57) ABSTRACT

A method of producing curved, folded or reconfigurable structures includes providing a polymer film, exposing the polymer film to at least one of patterned radiation or patterned chemical contact, and conditioning the polymer film subsequent to the exposing. The polymer film includes a polymer that is active to cross-linking of polymer chains in response to the exposing. The exposing is performed such that at least one exposed region of the polymer film develops a gradient in an amount of cross-linking of polymer chains along a cross-sectional direction of the polymer film, and the conditioning of the polymer film removes uncross-linked polymer chains to provide a curved, folded or reconfigurable structure.

9 Claims, 15 Drawing Sheets

(56) References Cited

PUBLICATIONS

Gravesen, P., Branebjerg, J., and Jensen, 0. S. Microfluidics-a review. J. Micrornech. Microeng. 3, 168-182 (1993).

Beebe, D. J., Mensing, G. A., and Walker, G. M. Physics and applications of microfluidics in biology. Annu. Rev. Biorned Eng. 4, 261-286 (2002).

Whitesides, G. M. The origins and the future of microfluidics. Nature 442, 368-373 (2006).

Keller, S., Blagoi, G., Lillemose, M., Haefliger, D., and Boisen, A. Processing of thin SU-8 films. J. Micromech. Microeng. 18, 125020 (2008).

Tan, T. L., Wong, D., Lee, P., Rawat, R. S., and Patran, A. Study of a chemically amplified resist for xray lithography by Fourier transform infrared spectroscopy. Appl. Spectrosc. 58, 1288-1294 (2004).

Dektar, J. L. and Hacker, N. P. Photochemistry of triaiylsulfonium salts. J. Am. Chern. Soc. 112, 6004-6015 (1990).

J.L. Ifkovits, et al., "Review: Photopolymerizable and Degradable Biomaterials for Tissue Engineering Applications," Tissue Engineering, vol. 13, No. 10 (2007).

Feng, R. and Farris, R. J. Influence of processing conditions on the thermal and mechanical properties of SUS negative photoresist coatings. J. Micromech. Microeng. 13, 80-88 (2003).

Sameoto, D., Tsang, S.-H., Foulds, I. G., Lee, S.-W. and Parameswaran, M., Control of the out-of-plane curvature in SU-8 complaint microstructures by exposure dose and baking times. J. Micromech. Microeng. 17, 1093-1098 (2007).

LaBianca, N.C. and Gelorme, J. D. High-aspect-ratio resist for thick-film applications. Proc. SPIE. 2438, 846-852 (1995).

Burckel, D. B., et al. Micrometer-scale cubic unit cell 3D metamaterial layers. Adv. Mater. 22, 5053-5057 (2010).

Garra, J., et al. Dry etching of polydimethylsiloxane for microfluidic systems. J Vac. Sci. Technol. A 20, 975-982 (2002).

Kim, R.-H., et al. Waterproof AlInGaP optoelectronics on stretchable substrates with applications in biomedicine and robotics. Nat. Mater. 9, 929-937 (2010).

Zheludev, N. I. A roadmap for metamaterials. Opt. Photonics News 22, 30-35 (2011).

Voskerician, G., et al. Biocompatibility and biofouling of MEMS drug delivery devices. Biomaterials 24, 1959-1967 (2003).

Sia, S. K. and Whitesides, G. M. Micro fluidic devices fabricated in poly(dimethylsiloxane) for biological studies. Electrophoresis. 24, 3563-3576 (2003).

El-Ali, J., Sorger, P. K., and Jensen, K. F. Cells on chips. Nature. 442, 403-411 (2006).

Lee, K. Y. and Mooney, D. J. Hydrogels for tissue engineering. Chern Rev. 101, 1869-1879 (2001).

Nguyen, K. T. and West, J. L. Photopolymerizable hydrogels for tissue engineering applications. Biomaterials. 23, 4307-4314 (2002).

Choi, N. W., etal. Microfluidic scaffolds for tissue engineering. Nat. Mater. 6, 908-915 (2007);.

Du, Y., Lo, E., Ali, S., and Khademhosseini, A. Directed assembly of cell-laden microgels for fabrication of 3D tissue constructs. Proc. Natl Acad Sci. USA 105, 9522-9527 (2008).

Guvendiren, M., Yang, S., and Burdick, J. A. Swelling-induced surface patterns in hydrogels with gradient crosslinking density. Adv. Funct. Mater. 19, 3038-3045 (2009).

Nojima, T. and Saito, K. Development of newly designed ultra-light core structures. JSME Int J, Ser. A, 49, 38-42 (2006).

Bassik, N., Stem, G. M., and Gracias, D. H. Microassembly based on hands free origami with bidirectional curvature. Appl. Phys. Lett. 95, 091901 (2009).

Chinthakindi, A. K. and Kohl, P. A., Electrostatic actuators with intrinsic stress gradient. J. Electrochem. Soc., 149, H146-H152 (2002).

Mohanty, S. and Beebe, D. J., Chips & Tips: PDMS connectors for macro to microfluidic interfacing. (2006).

Monahan, J. M., Gewirth, A. A., and Nuzzo, R. G., A method for filling complex polymeric microfluidic devices and arrays. Anal. Chem.13, 3193-3197 (2001).

K. C. Cole, A. Pilon, D. Noel, J.J. Hechler, A. Choulioutis, and K. C. Overbury. Comparison of Infrared spectroscopic methods of the quantitative analysis of epoxy resins used in carbon epoxy composite materials. Appl. Spectrosc. 42, 761 (1998).

Luchnikov, V., Sydorenko, 0., and Stamm, M., Self-rolled polymer and composite polymer/metal micro- and nanotubes with patterned inner walls, Adv. Mater. 17 (9), 1177 (2005).

Chiu, D. T., et. al., Patterned deposition of cells and proteins onto surfaces by using three-dimensional micro fluidic systems, PNAS 97 (6), 2408 (2000).

Leclerc, E., Sakai, Y., and Fujii, T., Cell culture in 3-dimensional micro fluidic structure of pdms (polydimethylsiloxane), Biomed. Microdevices 5 (2), 109 (2003).

Westwood, S. M., Jaffer, S., and Gray, B. L., Enclosed su-8 and pdms micro channels with integrated interconnects for chip-to-chip and world-to-chip connections, J. Micromech. Microeng. 18 (6),064014 (2008).

Mcdonald, J. C. and Whitesides, G. M., Poly(dimethylsiloxane) as a material for fabricating micro fluidic devices, Accounts Chem. Res. 35 (7), 491 (2002).

Cukierman, E., Pankov, R., and Yamada, K. M., Cell interactions with three dimensional matrices, Curro Opin. Cell. Bioi. 14 (5), 633 (2002).

\* cited by examiner

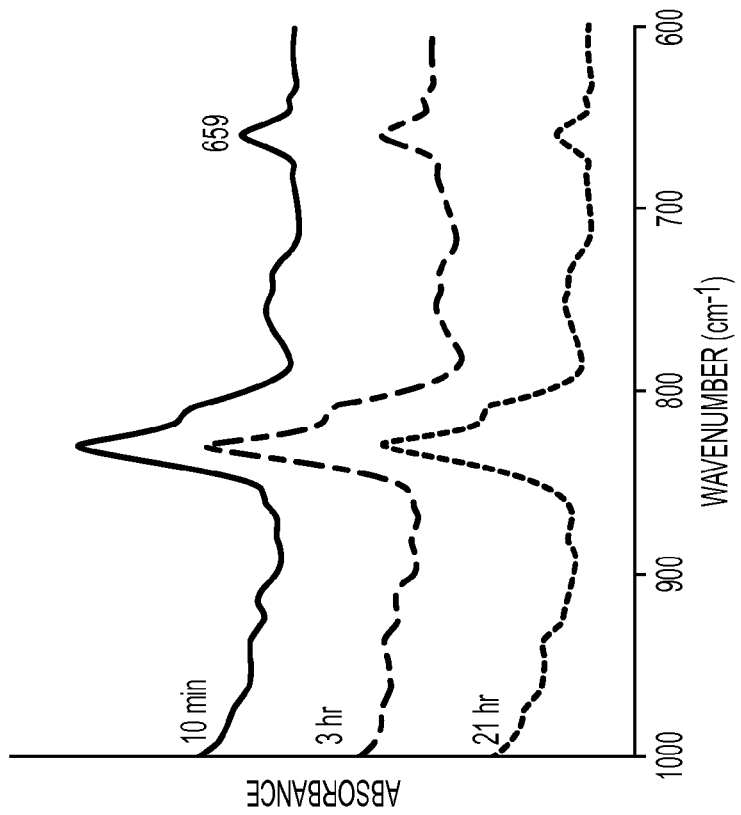
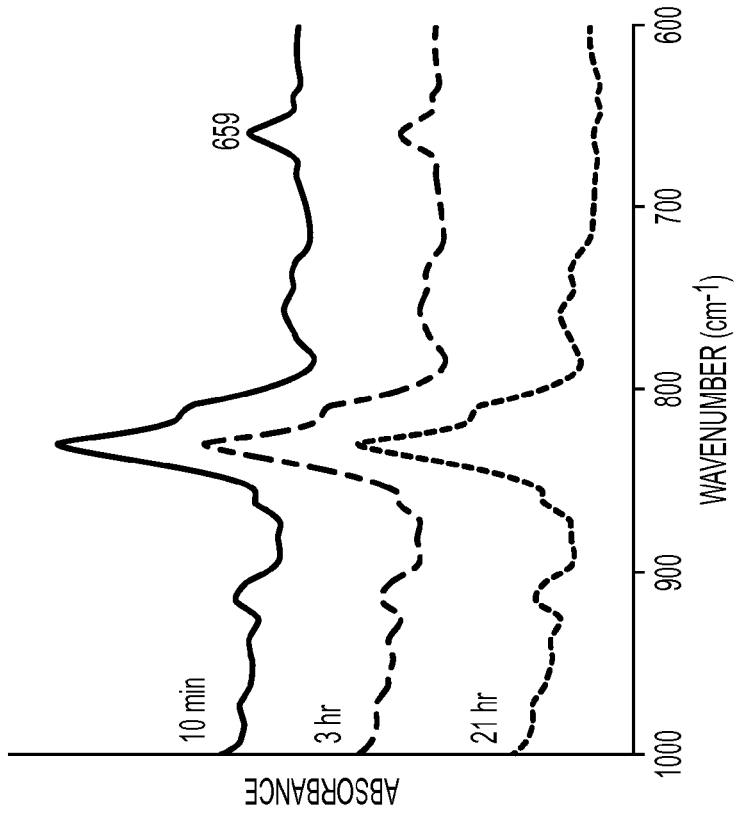

FLOWER ARRAY FABRICATION

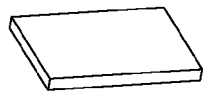 GLASS SUBSTRATE

 Cr MASK DEFINING FLOWERS THERMALLY DEPOSITED VIA LIFT-OFF METALLIZATION

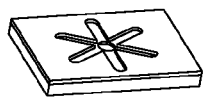 Cu SACRIFICIAL LAYER THERMALLY DEPOSITED ATOP FLOWER PETAL REGIONS (NOT AT CENTER OF FLOWERS) VIA LIFT-OFF METALLIZATION

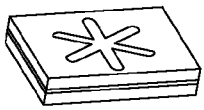 SINGLE 10.7 μm THICK LAYER OF SU-8 2015 UV EXPOSED THROUGH Cr MASK FROM BELOW (120 mJ/cm$^2$)

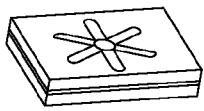 SAME LAYER UV EXPOSED THROUGH MASK DEFINING CENTERS OF FLOWERS FROM ABOVE (350 mJ/cm$^2$)

 SU-8 DEVELOPED

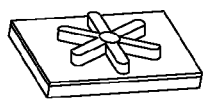 Cu WET-ETCHED TO RELEASE FLOWER PETALS

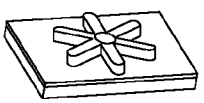 PETALS CONDITIONED IN ACETONE

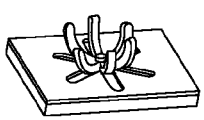 FLOWER ARRAY SELF-ASSEMBLED WHEN DE-SOLVATED

Figure 9

CYLINDER FABRICATION
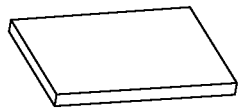 Si SUBSTRATE
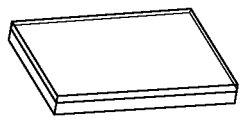 Cu SACRIFICIAL LAYER THERMALLY DEPOSITED
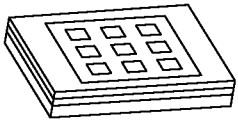 SINGLE 10.7 µm THICK LAYER OF SU-8 2015 UV EXPOSED THROUGH MASK FROM ABOVE (170 mJ/cm$^2$)
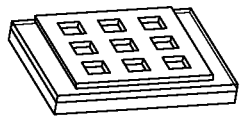 SU-8 DEVELOPED
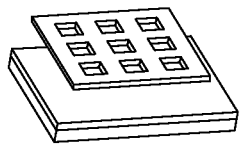 Cu WET-ETCHED TO RELEASE TEMPLATE
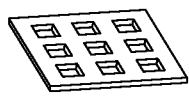 TEMPLATE CONDITIONED IN ACETONE
 CYLINDER SELF-ASSEMBLED WHEN DE-SOLVATED
Figure 10

BIDIRECTIONAL SHEET FABRICATION

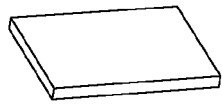 GLASS SUBSTRATE

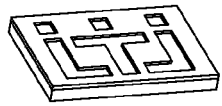 Cr MASK DEFINING BOTH SQUARE FACES AND VALLEY HINGES THERMALLY DEPOSITED VIA LIFT-OFF METALLIZATION

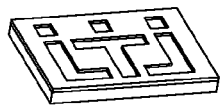 Cu SACRIFICIAL LAYER THERMALLY DEPOSITED

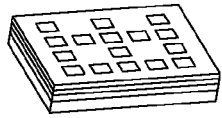 SINGLE 10.7 μm THICK LAYER OF SU-8 2015 UV EXPOSED THROUGH MASK DEFINING SQUARE FACES FROM ABOVE (350 mJ/cm$^2$)

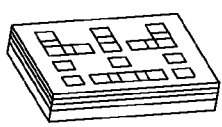 SAME LAYER UV EXPOSED THROUGH MASK DEFINING MOUNTAIN HINGES FROM ABOVE (90 mJ/cm$^2$)

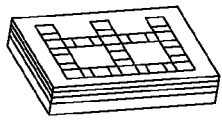 SAME LAYER UV EXPOSED THROUGH Cr MASK FROM BELOW (90 mJ/cm$^2$)

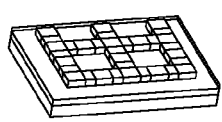 SU-8 DEVELOPED

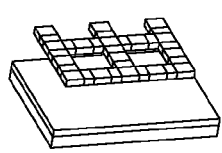 Cu WET-ETCHED TO RELEASE TEMPLATE

 TEMPLATE CONDITIONED IN ACETONE

 BIDIRECTIONAL SHEET SELF-ASSEMBLED WHEN DE-SOLVATED

Figure 12

CURVED AND FLEXIBLE MICROFLUIDICS

CROSS-REFERENCE OF RELATED APPLICATION

This application claims priority to U.S. Provisional Application No. 61/406,346 filed Oct. 25, 2010, the entire contents of which are hereby incorporated by reference, and is a U.S. National Stage Application under 35 U.S.C. §371 of PCT/US2011/057696, filed Oct. 25, 2011, the entire contents of which are incorporated herein by reference.

This invention was made with Government support of Grant No. DP2-OD004346-01 and DP2-OD004346-01S1, awarded by NIH; and Grant No. DGE-0549350, awarded by NSF. The U.S. Government has certain rights in this invention.

BACKGROUND

1. Field of Invention

The field of the currently claimed embodiments of this invention relates to methods of producing curved, folded or reconfigurable structures and the curved, folded or reconfigurable structures.

2. Discussion of Related Art

Thin films with heterogeneous mechanical properties such as modulus, thickness or stress will spontaneously assemble into 3D structures (Bowden, N., Brittain, S., Evans, A. G., Hutchinson, J. W., and Whitesides, G. M. Spontaneous formation of ordered structures in thin films of metals supported on an elastomeric polymer. *Nature* 393, 146-149 (1998); Mahadevan, L. and Rica, S. Self-organized origami. *Science* 307, 1740 (2005); Jamal, M., Bassik, N., Cho, J.-H., Randall, C. L., and Gracias, D. H. Directed growth of fibroblasts into three dimensional micropatterned geometries via self-assembling scaffolds. *Biomaterials* 31, 1683-1690 (2010)). Several studies have sought to drive the self-assembly of polymeric thin films by inducing heterogeneities in material composition (Bates, F. S. and Fredrickson, G. H. Block copolymers-designer soft materials. *Phys. Today* 52, 32-38 (1999); Harris, K. D., Bastiaansen, C. W. M., and Broer, D. J. A glassy bending-mode polymeric actuator which deforms in response to solvent polarity. *Macromol. Rapid Comm.* 27, 1323-1329 (2006); Klein, Y., Efrati, E., and Sharon, E. Shaping of elastic sheets by prescription of non-Euclidean metrics. *Science* 315, 1116-1120 (2007)). Self-assembly techniques have also previously been shown to spontaneously curve and fold two-dimensional (2D) micropatterned polymeric templates into 3D structures (Guan, J., He, H., Hansford, D. J., and Lee, L. J. Self-folding of three-dimensional hydrogel microstructures. *J Phys. Chem. B* 109, 23134-23137 (2005); Azam, A., Laflin, K. E., Jamal, M., Fernandes, R., and Gracias, D. H. Self-folding micropatterned polymeric containers. *Biomed Microdevices* 13, 51-58 (2011); Jeong, K.-U., et al. Three-dimensional actuators transformed from the programmed two-dimensional structures via bending, twisting and folding mechanisms. *J. Mater. Chem.* 21, 6824-6830 (2011); Stoychev, G., Puretskiy, N., and Ionov, L. Self-folding all-polymer thermoresponsive microcapsules. *Soft Matter* 7, 3277-3279 (2011)). Yet, the self-assembly of structures with integrated microfluidic networks to enable the delivery of chemicals in curved geometries and the development of vascularized 3D systems remains a significant challenge (Borenstein, J. T., et al. Microfabrication technology for vascularized tissue engineering. *Biomed. Microdevices* 4, 167-175 (2002); Andersson, H. and van den Berg, A. Microfabrication and microfluidics for tissue engineering: state of the art and future opportunities. *Lab Chip* 4, 98-103 (2004); Kelm, J. M., et al. Design of custom-shaped vascularized tissues using microtissue spheroids as minimal building units. *Tissue Eng.* 12, 2151-2160 (2006); McGuigan, A. P. and Sefton, M. V. Vascularized organoid engineered by modular assembly enables blood perfusion. *Proc. Natl Acad. Sci. USA* 103, 11461-11466 (2006); Griffith, L. G. and Swartz, M. A. Capturing complex 3D tissue physiology in vitro. *Nat. Rev. Mol. Cell Biol.* 7, 211-224 (2006)). Conventional microfluidic systems are typically built using layer-by-layer lithographic patterning methods on inherently planar substrates. Hence, while engineered microfluidic systems afford the manipulation of small liquid volumes for a variety of applications (Gravesen, P., Branebjerg, J., and Jensen, O. S. Microfluidics-a review. *J. Micromech. Microeng.* 3, 168-182 (1993); Beebe, D. J., Mensing, G. A., and Walker, G. M. Physics and applications of microfluidics in biology. *Annu. Rev. Biomed. Eng.* 4, 261-286 (2002); Whitesides, G. M. The origins and the future of microfluidics. *Nature* 442, 368-373 (2006)), they are typically confined to block-like devices. Thus in order to self-assemble microfluidic systems into 3D geometries, there remains a need for methods to produce curved, folded and/or self-assembled structures and for the improved structures.

SUMMARY

A method of producing curved, folded or reconfigurable structures according to an embodiment of the current invention includes providing a polymer film, exposing the polymer film to at least one of patterned radiation or patterned chemical contact, and conditioning the polymer film subsequent to the exposing. The polymer film includes a polymer that is active to cross-linking of polymer chains in response to the exposing. The exposing is performed such that at least one exposed region of the polymer film develops a gradient in an amount of cross-linking of polymer chains along a cross-sectional direction of the polymer film, and the conditioning of the polymer film removes uncross-linked polymer chains to provide a curved, folded or reconfigurable structure.

Curved, folded or reconfigurable structure according to some embodiments of the current invention are produced according methods of embodiments of the current invention.

A curved, folded or reconfigurable structure according to an embodiment of the current invention includes a curved, folded or reconfigurable polymer film having at least one portion that has a gradient in an amount of cross-linking of polymer chains along a cross-sectional direction thereof. The at least one portion that has a gradient in an amount of cross-linking of polymer chains along a cross-sectional direction is responsive to an environmental stimulus to change an amount of curvature.

BRIEF DESCRIPTION OF THE DRAWINGS

Further objectives and advantages will become apparent from a consideration of the description, drawings, and examples.

FIG. 1(*a*) is a schematic showing the CLG formation within a low UV exposed SU-8 film, which results in a stress (σ) gradient along the film thickness (d), upon conditioning of the film in acetone to remove un-crosslinked material. FIG. 1(*b*) illustrates that when water is added, the film is de-solvated and the less crosslinked side undergoes greater compression, causing the film to curve. FIG. 1(*c*) illustrates that immersion in acetone re-solvates the film, causing the film to flatten. FIG.

1(d) shows fluorescence images of an example of an array of flower-shaped structures that (top) reversibly curved upon de-solvation and (bottom) flattened upon re-solvation. Scale bars are 100 μm.

Figure 2:
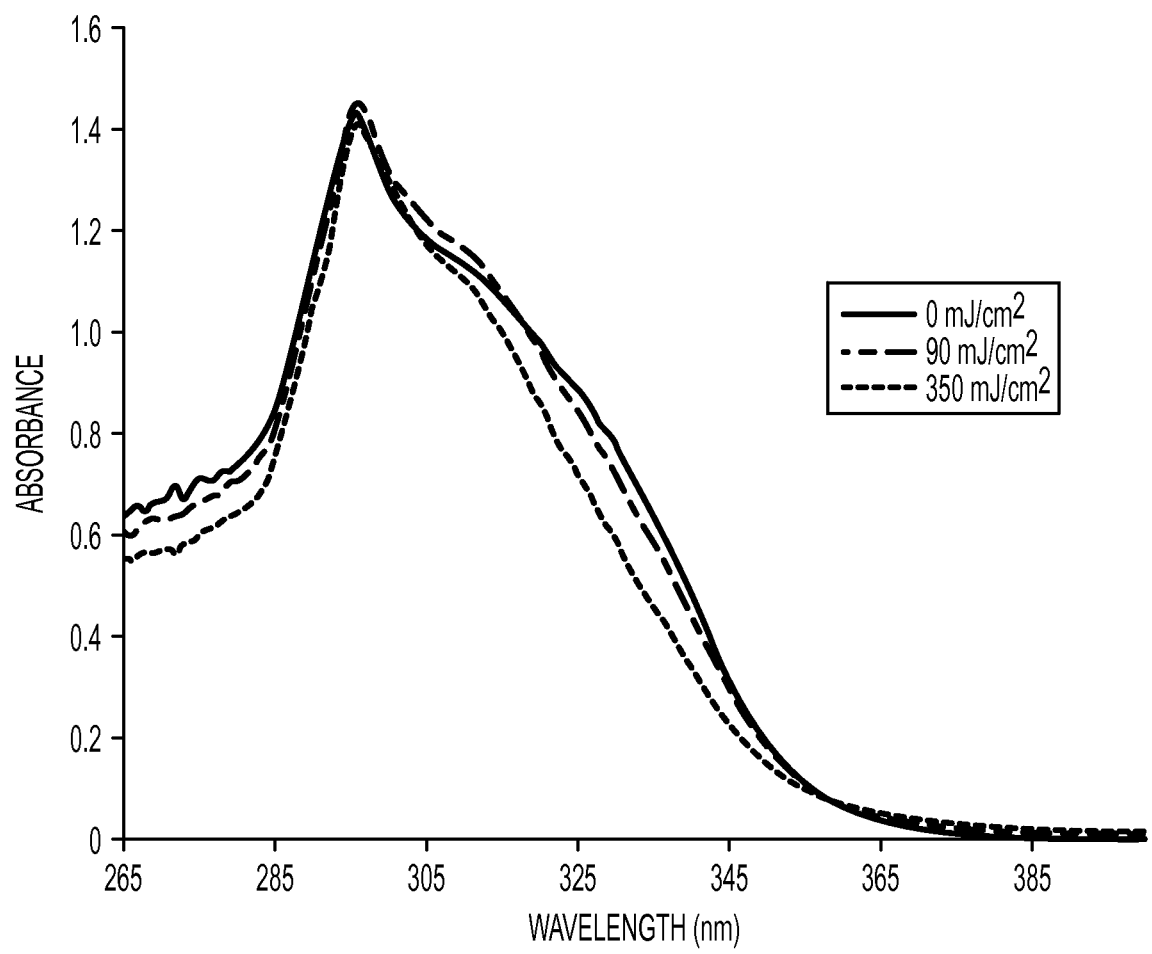

FIG. 2 shows ultraviolet (UV) absorption spectra of 10.7 μm thick SU-8 films. The films were UV-exposed for 0, 90, and 350 mJ/cm$^2$ prior to taking absorption measurements. The absorption measurements were done using a Spectramax Plus 384 microplate spectrophotometer [Molecular Probes]. The wavelengths were varied in 1 nm intervals and curves represent the average of 4 readings. The measured spectra show that SU-8 absorbs light at low UV wavelengths.

Figure 3:
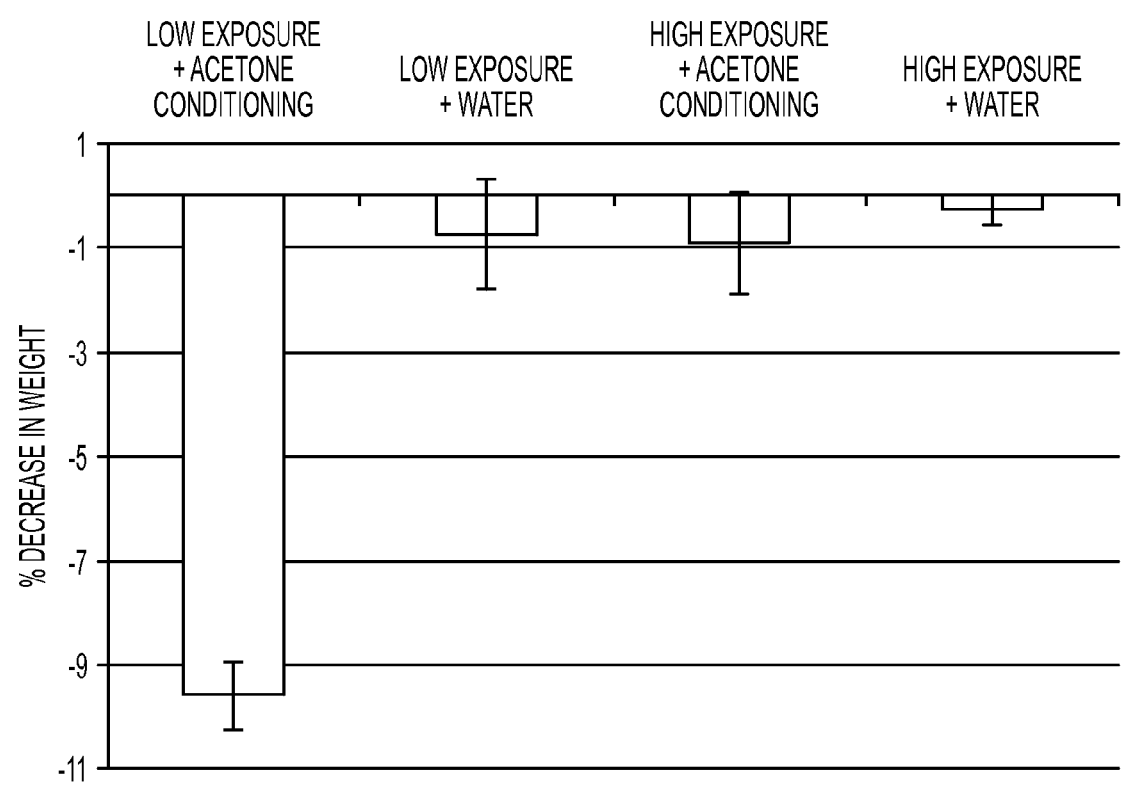

FIG. 3 shows average percentage weight decrease for low- and high-UV exposed SU-8 films that were soaked in either acetone (conditioned) or deionized (DI) water (control). Dry weights were measured before and after the films were soaked. The plotted values represent the average over three samples and the bars denote the standard deviation. A significant dry weight loss of approximately 9.6% was observed for low-UV exposed SU-8 that was acetone conditioned. In contrast, high-UV exposed films that were acetone conditioned, as well as both low and high UV exposed films that were soaked in DI water, showed a weight loss of less than 1%. These results show that acetone conditioning resulted in the removal of un-crosslinked material that was present to a significant extent in low-UV exposed SU-8 films.

Figure 4A:
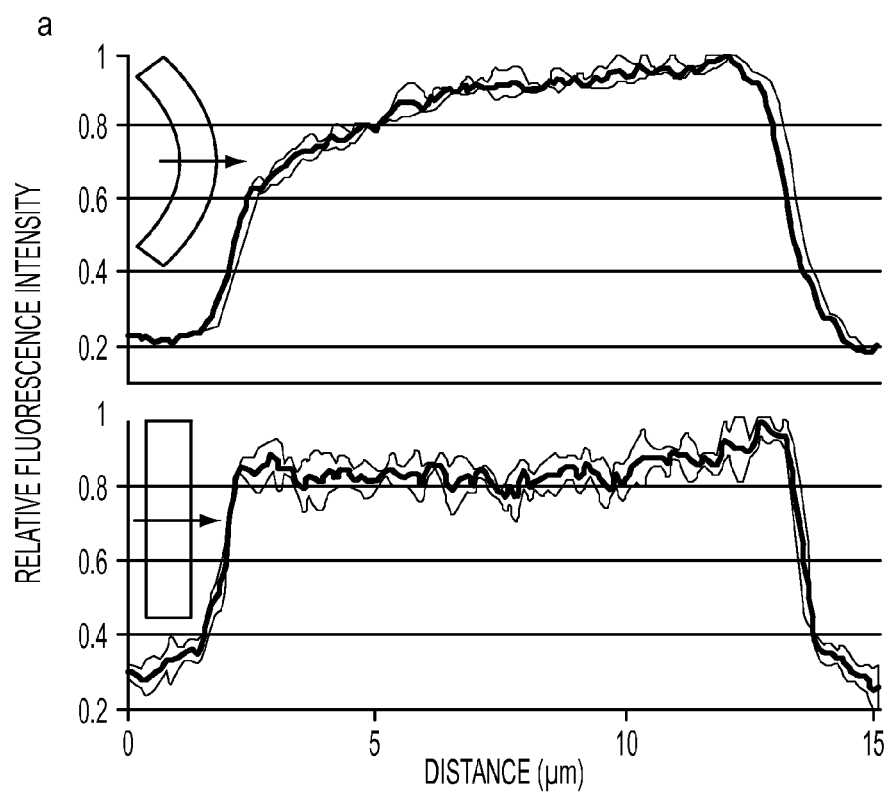
Figure 4B:
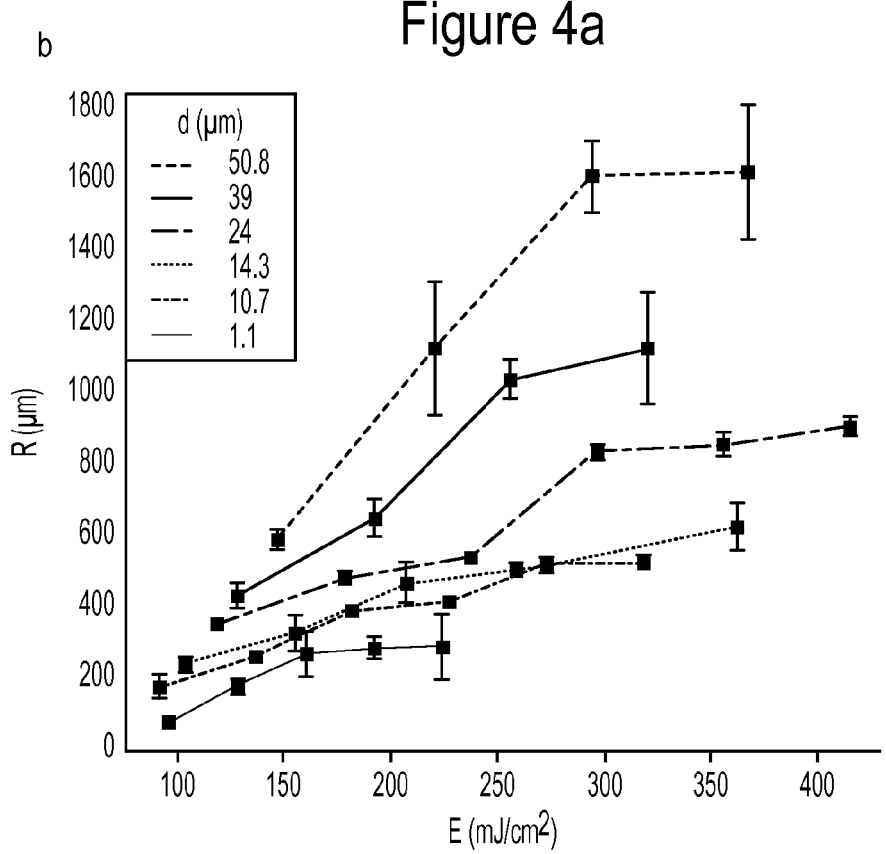

FIGS. 4(a) and 4(b) provide results for characterization of differentially crosslinked films. FIG. 4(a) shows relative fluorescence intensity profiles of conditioned and sectioned SU-8 films that were UV exposed for (top) 80 mJ/cm$^2$ (32-42% of manufacturer's suggested energy) and (bottom) 300 mJ/cm$^2$ (>100% of suggested energy). Plots are averages of three lines. Shaded regions denote the standard deviation. FIG. 4(b) shows a plot of the average radius of curvature versus UV exposure energy of free-floating, self-assembled 1.5 mm×0.15 mm beams of varying film thickness. n is 6 (4 for 1.1 μm) and bars denote standard deviations.

Figure 5:
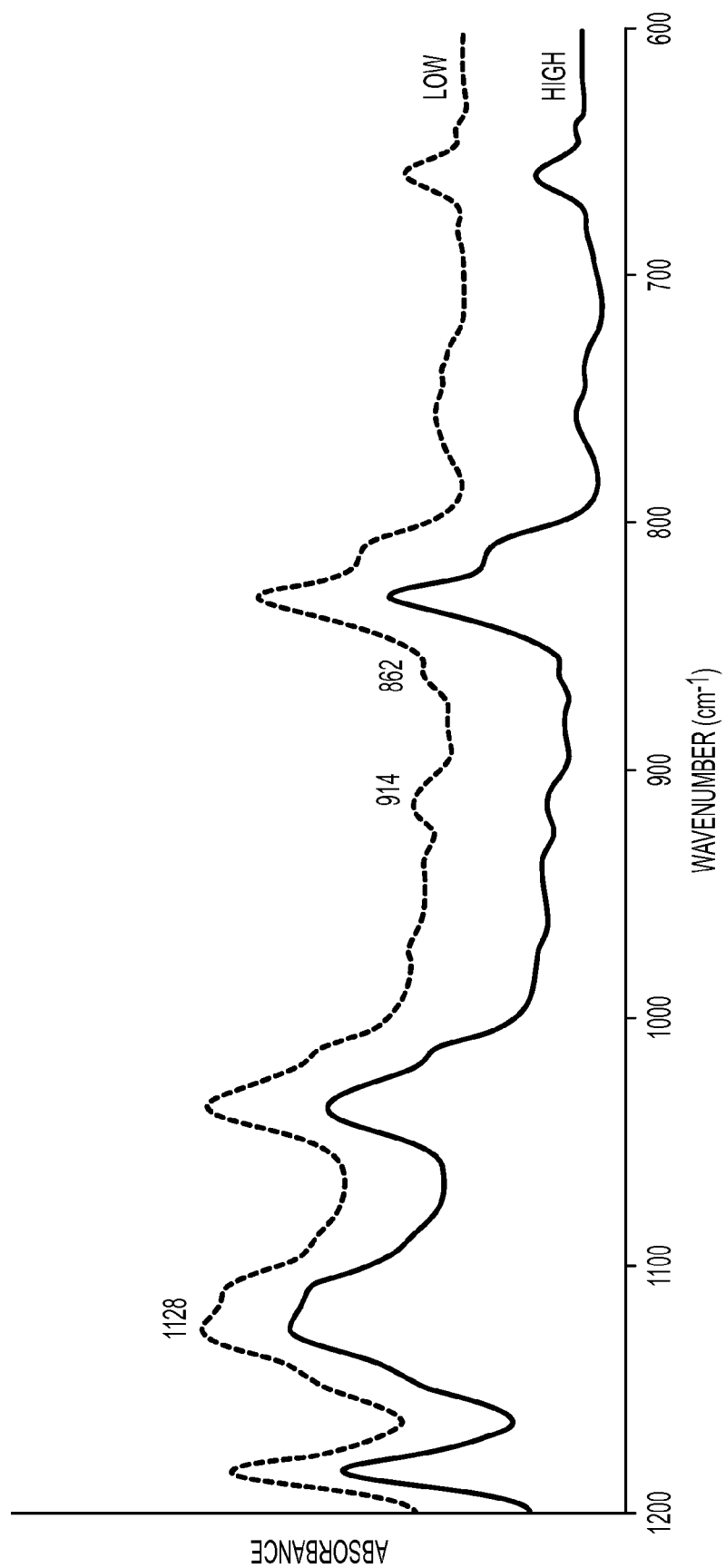

FIG. 5 provides FTIR spectra of low- and high-UV exposed SU-8 films prior to acetone conditioning. The high-exposed SU-8 film exhibits a greater peak intensity at 1128 cm$^{-1}$ compared to the low exposed film. This peak is associated with ether bonds of crosslinked SU-8 (Keller, S., Blagoi, G., Lillemose, M., Haefliger, D., and Boisen, A. Processing of thin SU-8 films. *J. Micromech. Microeng.* 18, 125020 (2008); Tan, T. L., Wong, D., Lee, P., Rawat, R. S., and Patran, A. Study of a chemically amplified resist for x-ray lithography by Fourier transform infrared spectroscopy. *Appl. Spectrosc.* 58, 1288-1294 (2004)) and the intensity is expected to increase with increasing crosslinking, as observed. A corresponding decrease in the peak intensities at epoxy group absorbances 914 cm$^{-1}$ and 862 cm$^{-1}$, associated with epoxide rings of un-crosslinked SU-8, was also observed for high-exposed SU-8. Both observations confirm that SU-8 is less-crosslinked after low exposures as compared to high exposures, as expected.

FIGS. 6(a) and 6(b) provide FTIR spectra of (FIG. 6(a)) low- and (FIG. 6(b)) high-UV exposed SU-8 films after conditioning in acetone for 10 min, 3 hrs and 21 hrs. All films showed a progressive decrease in absorbance intensity at 659 cm$^{-1}$ with increasing conditioning time. This peak likely corresponds to the photoinitiator triarylsulfonium hexafluoroantimonate (Dektar, J. L. and Hacker, N. P. Photochemistry of triarylsulfonium salts. *J. Am. Chem. Soc.* 112, 6004-6015 (1990)) and the decrease in peak height suggests that the photoinitiatior is removed. This removal was dependent on both the extent of crosslinking and the conditioning time. Low-exposed SU-8 films showed a significantly greater and faster decrease in absorbance at this peak.

Figure 7C:
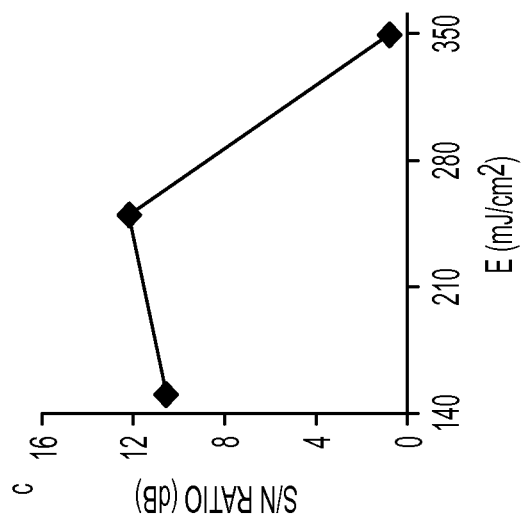
Figure 7B:
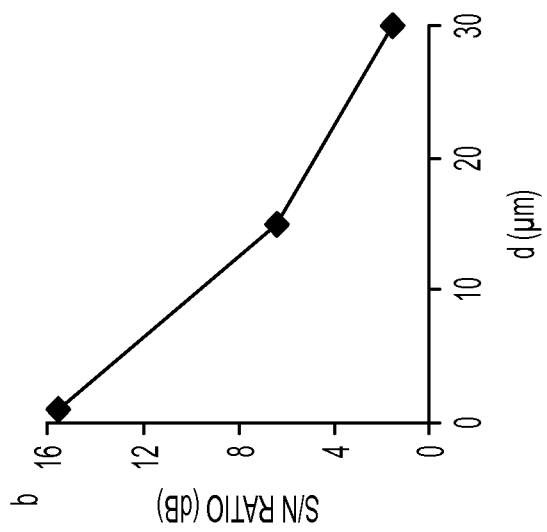
Figure 7A:
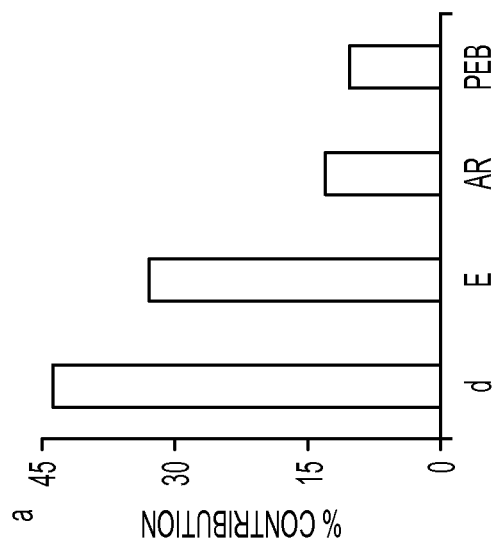

FIGS. 7(a)-7(c) provide (FIG. 7(a)) percent contribution of individual Taguchi Design of Experiments parameters on SU-8 curvature: d, the film thickness, E, the UV exposure energy, AR, the patterned aspect ratio, and PEB, the post exposure bake temperature. The percent contribution of the different factors was calculated using the analysis of variance statistical method as a part of the Taguchi analysis. SU-8 thickness and UV exposure energy were the two dominant factors, together accounting for 76.5% of the contribution. The post exposure bake temperature and aspect ratio of SU-8 structures were significantly less influential, accounting for 13% and 10%, respectively. (FIG. 7(b)) Sensitivity analysis of resist thickness. (FIG. 7(c)) Sensitivity analysis of exposure energy.

Figures 8A, 8B, 8C, 8D, 8E, 8F:
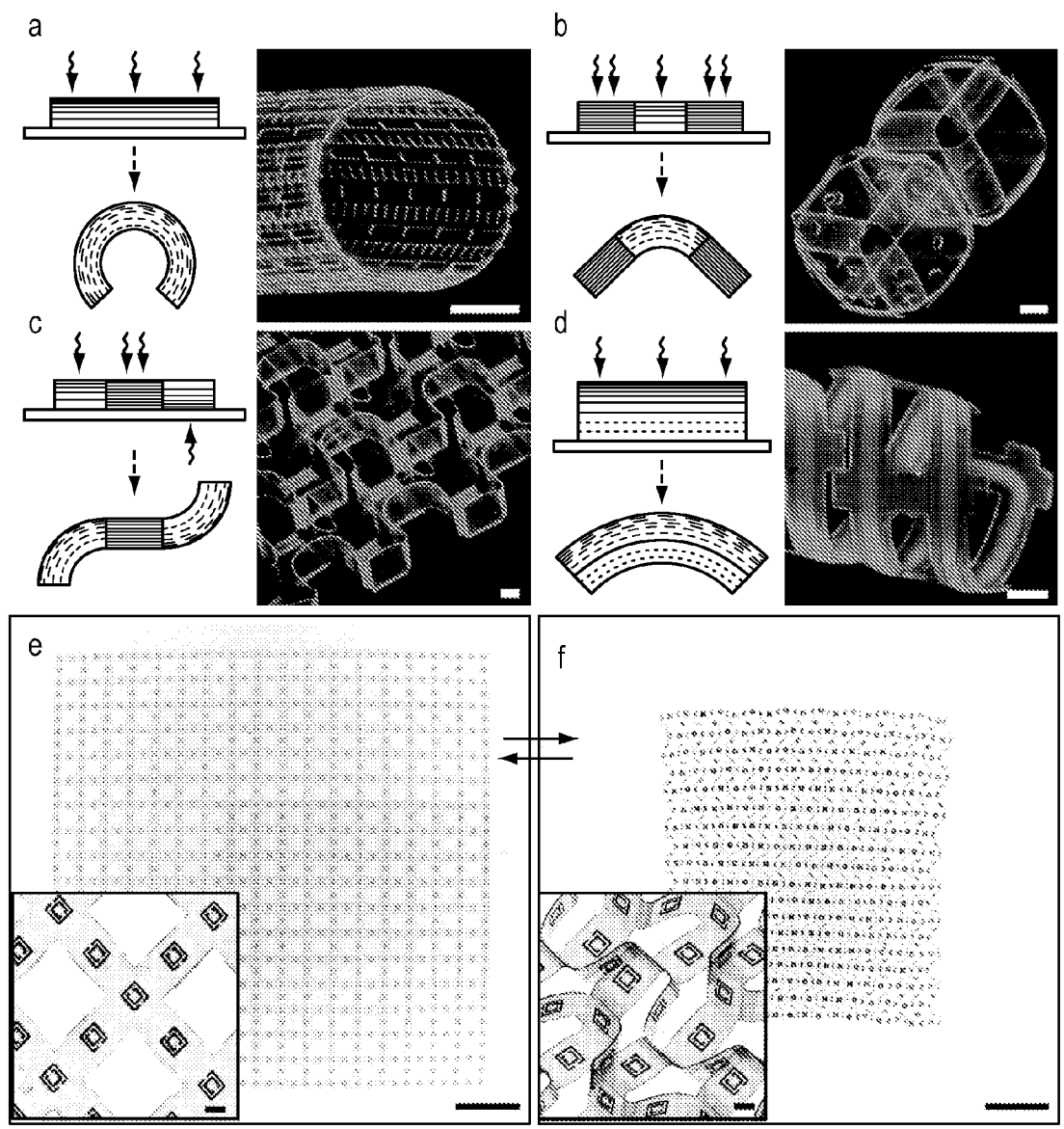

FIGS. 8(a)-8(f) show schematics and experimental realizations illustrating the versatility of the self-assembly methodology according to some embodiments of the current invention. FIGS. 8(a)-8(d) provide schematics and fluorescence images of differentially photo-crosslinked and self-assembled SU-8 geometries. FIG. 8(a) shows a cylindrical mesh with hollow rectangular micropatterns and a uniform radius of curvature was self-assembled by creating a uniform CLG across the entire SU-8 film. FIG. 8(b) shows patterned and unpatterned cubes that were self-assembled with CLG hinges and flat, high-crosslinked square faces. FIG. 8(c) shows an SU-8 sheet exhibiting bidirectional curvature was self-assembled with high-crosslinked square faces and both top and bottom exposed CLG hinges. FIG. 8(d) shows a hybrid SU-8/PDMS microfluidic device was self-assembled using a CLG-containing SU-8 layer to curve an underlying PDMS channel. Red lines indicate a segment of the hollow microfluidic channel. FIGS. 8(e), 8(f) show brightfield images of a free-floating bidirectionally folded sheet with micrometer-scale gold SRRs patterned on the square faces. The sheet was reversibly self-assembled such that the SRRs were, either FIG. 8(e) in a single plane when the structure flattened in acetone, or FIG. 8(f) arranged along the x, y and z axes when the structure was de-solvated. Insets show magnified views of representative regions from the same film. Scale bars are 250 μm FIGS. 8(a)-8(d) and 8(e), 8(f) insets; 3 mm FIGS. 8(e) and 8(f).

FIG. 9 is a schematic illustration of the fabrication steps for self-assembling flower-shaped structures anchored to a substrate for the example of (FIG. 1d) according to an embodiment of the current invention.

FIG. 10 is a schematic illustration of the fabrication steps for self-assembling cylinders for the example of (FIG. 8a) according to an embodiment of the current invention.

Figure 11:
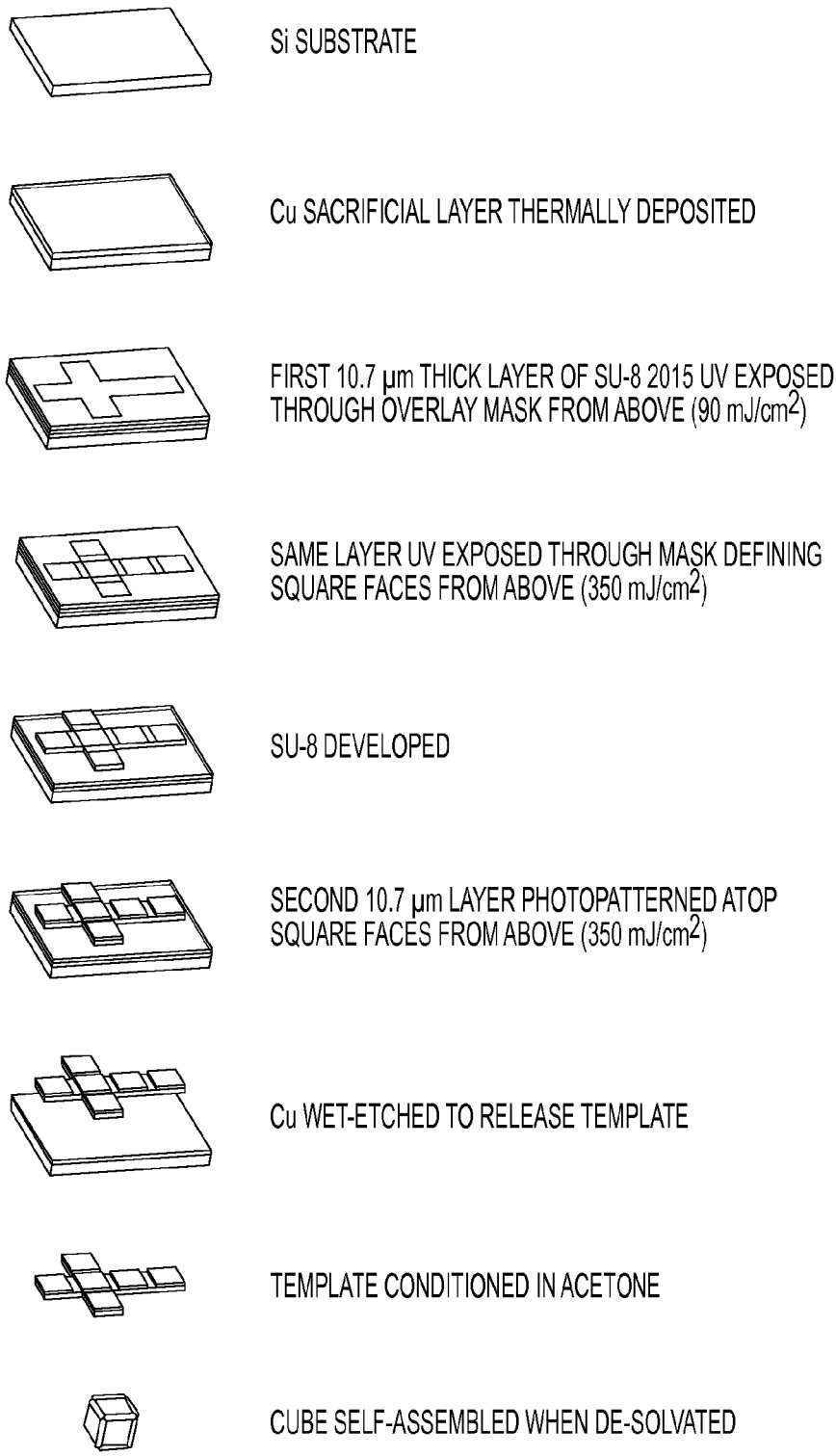

FIG. 11 is a schematic illustration of the fabrication steps for self-assembling cubes for the example of (FIG. 8b) according to an embodiment of the current invention.

FIG. 12 is a schematic illustration of the fabrication steps for self-assembling bidirectional sheets for the example of (FIGS. 8c, 8e, 8f) according to an embodiment of the current invention.

Figures 13A, 13B, 13C, 13D, 13E, 13F:
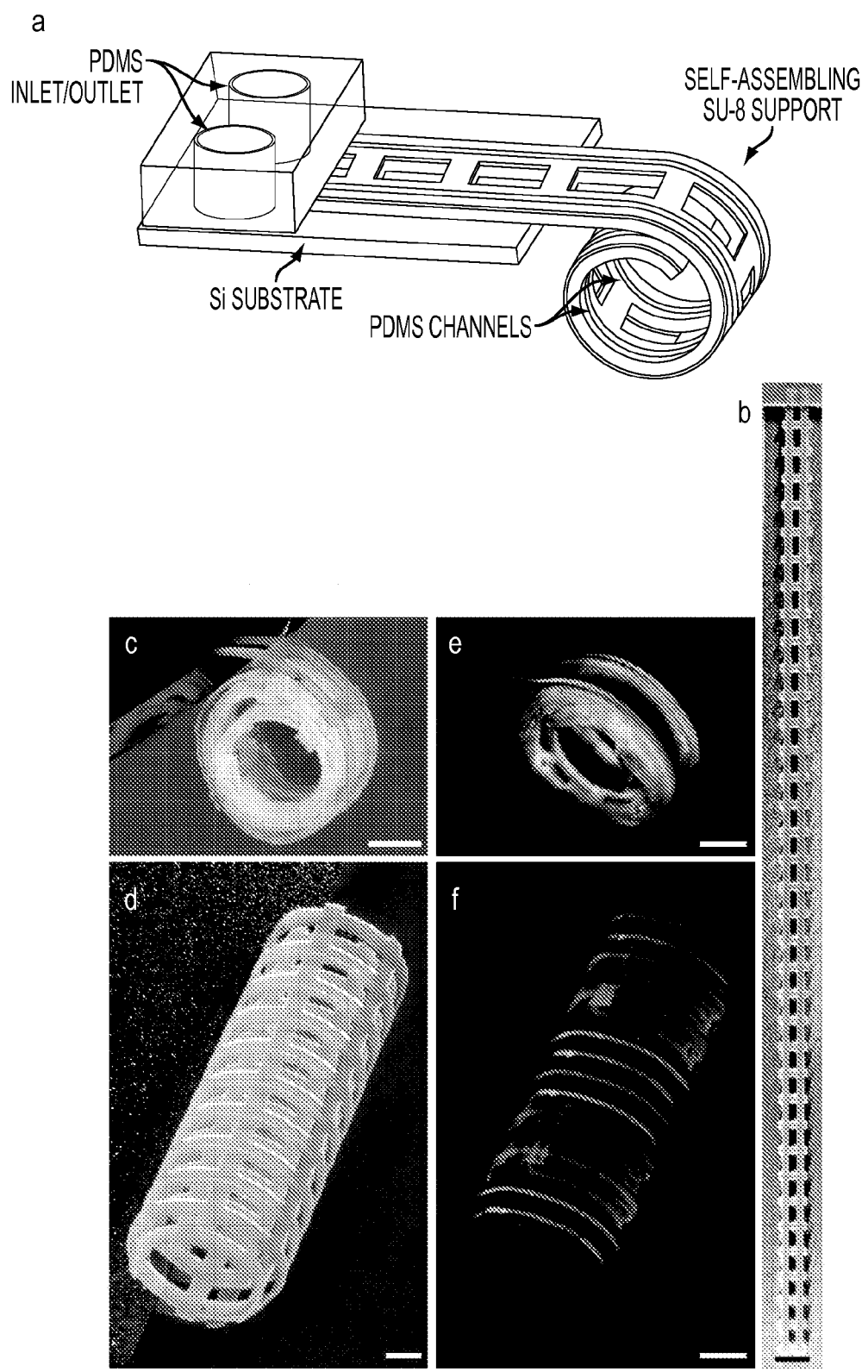

FIG. 13(a)-13(f) show an example of self-assembling microfluidic devices according to an embodiment of the current invention. FIG. 13(a) is an illustration of a self-assembling microfluidic device with PDMS inlets/outlets attached to a Si substrate and with PDMS channels integrated with a differentially crosslinked SU-8 film. FIGS. 13(b), 13(c) show brightfield images of a 3.5 cm long multilayer SU-8/PDMS microfluidic device containing a single channel, (b) as patterned on a Si substrate, and (c) after self-assembly. FIG. 13(d) is a brightfield image of a self-assembled microfluidic device with dual channels. FIGS. 13(e), 13(f) provide fluorescence images showing the flow of (e) fluorescein (green), and (f) fluorescein (green)/rhodamine B (red) through single and dual channel devices, respectively. Scale bars are 500 μm (1 mm for b).

Figure 14:
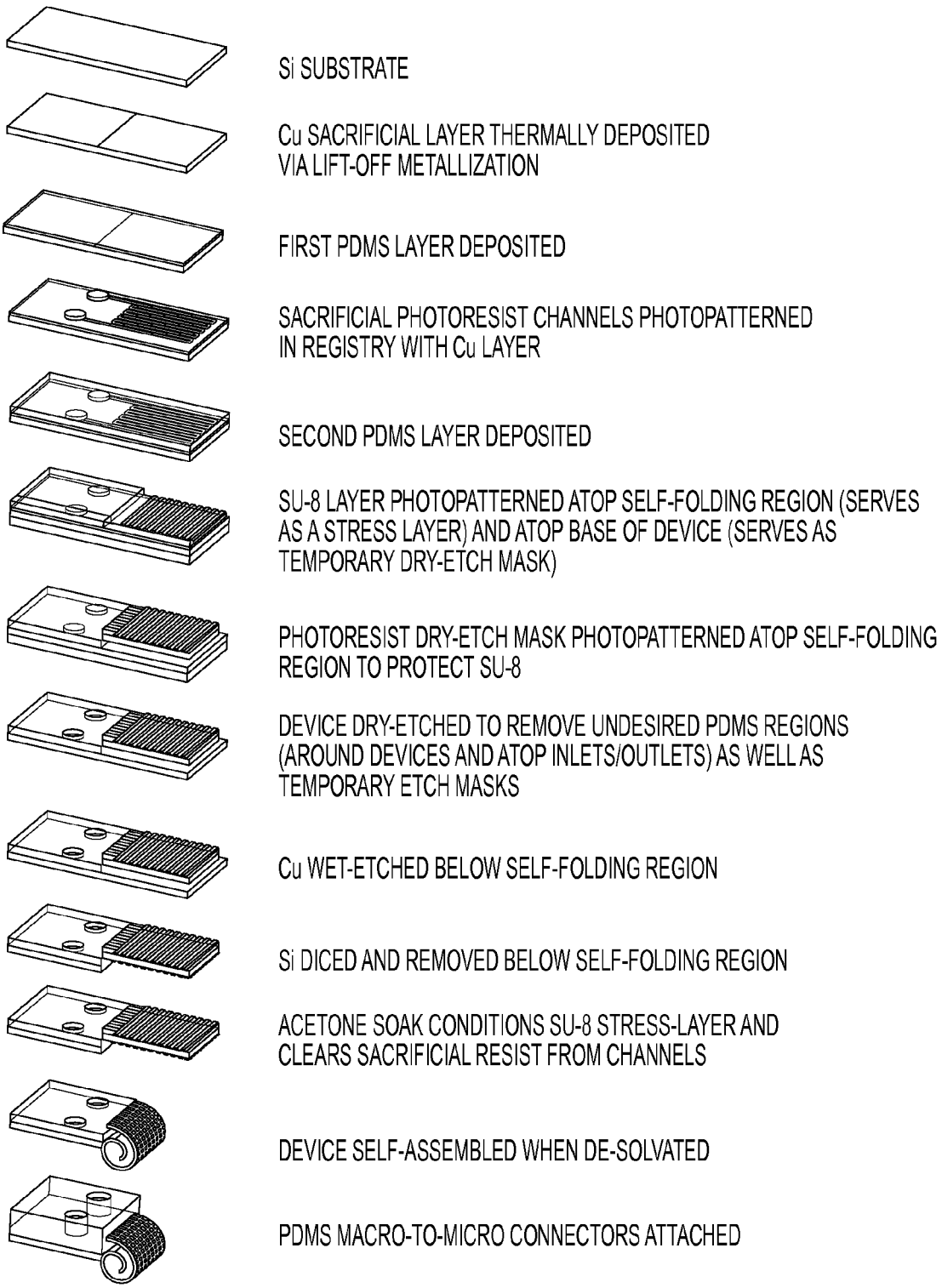

FIG. 14 is a schematic illustration of the fabrication steps for the self-assembling microfluidic devices for the example of (FIGS. 8d, and 13(a)-13(f)) according to an embodiment of the current invention.

Figure 15:
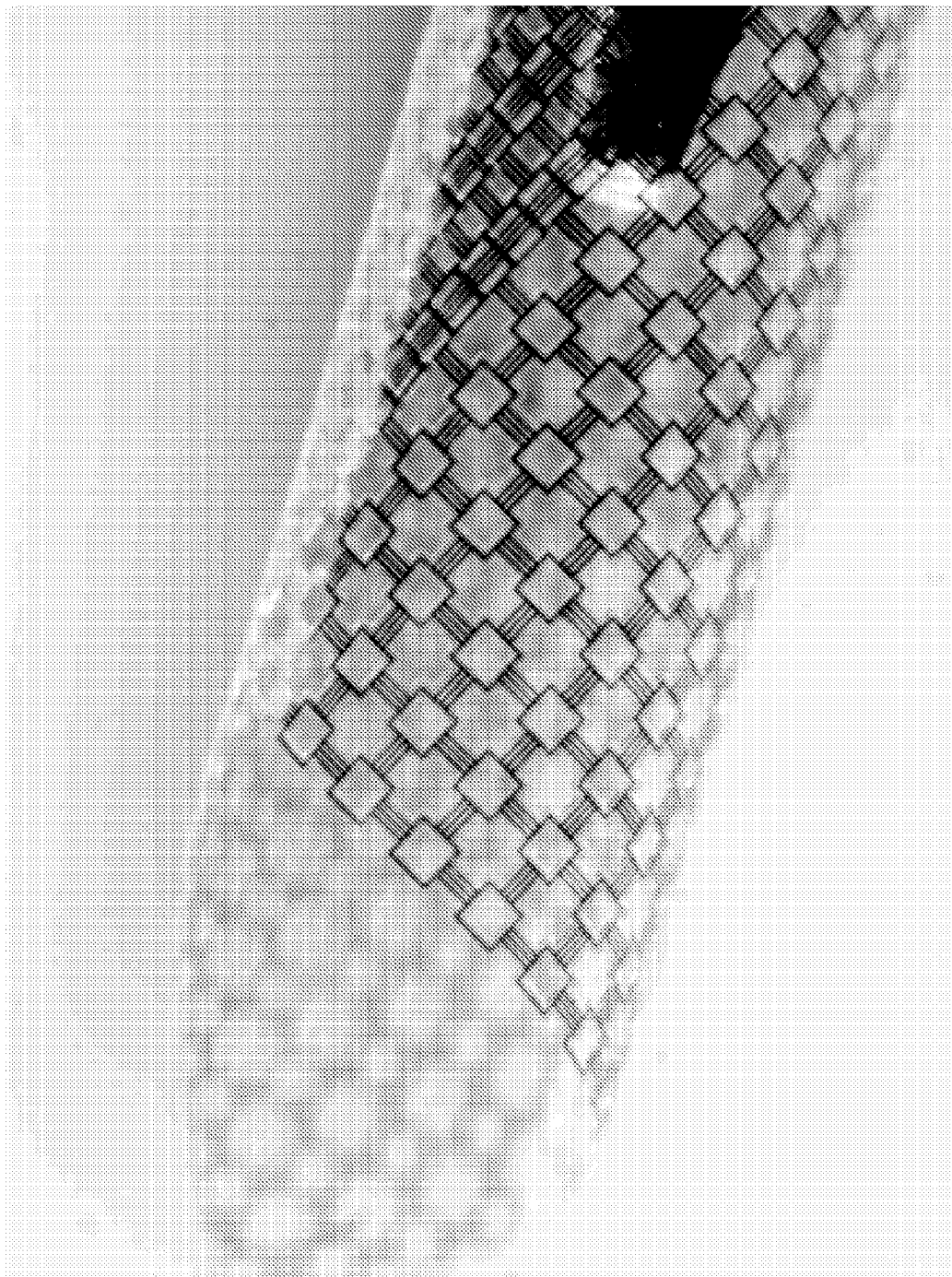

FIG. 15 shows an example of an antenna array according to an embodiment of the current invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

A method of producing curved, folded or reconfigurable structures according to some embodiments of the current invention includes providing a polymer film, exposing the polymer film to at least one of patterned radiation or patterned chemical contact, and conditioning the polymer film subsequent to the exposing. The polymer film includes a polymer that is active to cross-linking of polymer chains in response to the exposing. The exposing is performed such that exposed regions of the polymer film each develops a gradient in an amount of cross-linking of polymer chains along a cross-sectional direction of the polymer film, and the conditioning the polymer film removes uncross-linked polymer chains to provide a curved, folded or reconfigurable structure.

In the examples shown in detail below, we used light to achieve differential cross-linking, for example via photolithography. However, the general concepts of the current invention are not limited to only the use of light. Other physical and chemical methods can also be used. These include, for example, electron irradiation which can induce cross-linking at low dosages. Alternatively, differential diffusion based cross-linking can be achieved with the use of chemicals such as calcium salts or enzymes such as transglutaminase. The term light as used herein is intended to have a broad meaning to include both visible and non-visible regions of the electromagnetic spectrum. For example, infrared (IR) and ultraviolet light (UV) is intended to be included in the definition of light along with the visible portion of the spectrum.

Figures 1A, 1B, 1C, 1D:
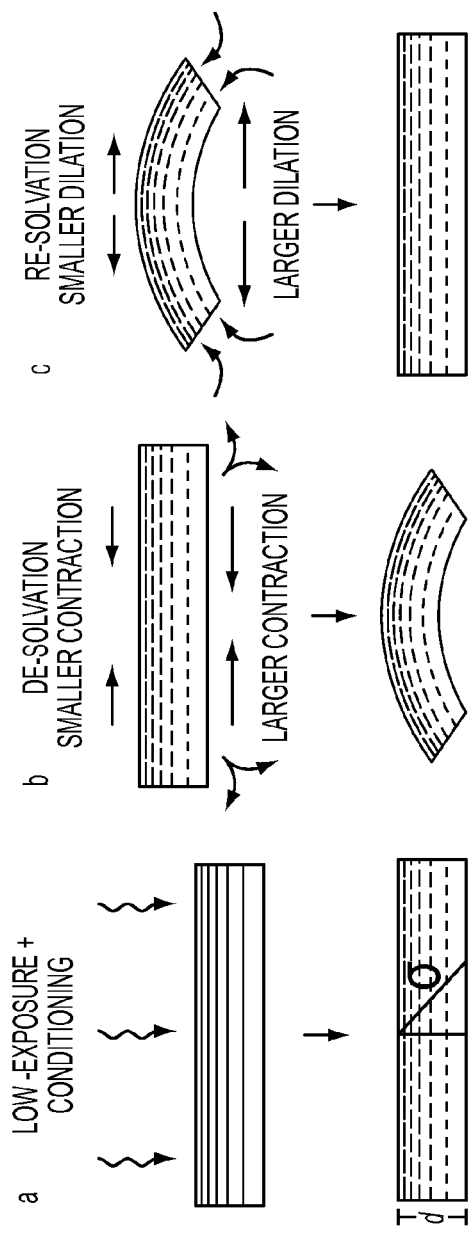
FIGS. 1(*a*)-1(*d*) include schematic illustrations and examples to explain some concepts of the current invention.

FIGS. 1(a)-1(c) help illustrate some concepts of the current invention, and FIG. 1(d) shows an example. In FIG. 1(a), the exposure can be by a photolithographic process, for example. However, as noted above, the general concepts of the current invention are not limited to this particular example. By controlling the amount of exposure, the top regions of the polymer film in the diagram are exposed more than the lower regions. Further processing steps can be included, for example a baking step, or other steps depending on the particular type of exposing. This leads to more cross-linking at the top of the film than at the bottom. There is thus a gradient in the amount of cross-linking along the cross-section direction d in FIG. 1(a). The conditioning removes uncrosslinked polymer chains to result in a structure illustrated schematically in FIGS. 1(b) and 1(c) which can be caused to bend or flatten depending on the particular environmental stimulus. For example, allowing the structure to dry, or immersing it in water, causes the structure in the example of FIGS. 1(a)-1(d) to become curved, folded or to self assemble, depending on the particular application. Immersing the structure in an organic solvent, such as, but not limited to, acetone causes this particular exemplar structure to flatten out again. The process can be repeatable according to some embodiments of the current invention. In some embodiments, only a small amount of hysteresis in bending cycles was found.

The terms "curved, folded or reconfigurable structures" are intended to include structures that are intended to become curved, structures which can fold in more complex ways, and/or structures that can act to self-assemble into more complex and/or composite structures, for example. One should be able to recognize from the concept illustrated in FIGS. 1(a)-1(c), that a very wide range of structures can be constructed. For example, photolithographic patterning techniques can be used according to some embodiments of the current invention to provide desired exposure patterns to expose particular regions of a polymer layer, while leaving other regions unexposed.

According to some embodiments of the current invention, the polymer film can be, but is not limited to, a biodegradable polymer film. For example, methods according to some embodiments of the current invention can also be utilized to create gradients in biodegradable and photopolymerizable/crosslinkable polymers. Such polymers include, but are not limited to, hydrogels that are polyethylene glycol (PEG) based, such as polyethylene glycol diacrylate, as well as gels based on polypropylene fumarate)s, poly(α-hydroxy ester)s, poly(vinyl alcohol), poly(β-amino ester)s, collagen, hyaluronic acid, dextran, and chitosan. For further examples of biodegradable polymers, see, for example, J. L. Ifkovits, et al., "Review: Photopolymerizable and Degradable Biomaterials for Tissue Engineering Applications," Tissue Engineering, Vol. 13, No. 10 (2007), the entire contents of which are incorporated herein by reference.

Some embodiments of the current invention are directed to curved, folded or reconfigurable structures produced according to methods of the current invention.

Further embodiments of the current invention are directed to a curved, folded or reconfigurable structure that includes a curved, folded or reconfigurable polymer film having at least one portion that has a gradient in an amount of cross-linking of polymer chains along a cross-sectional direction thereof. The at least one portion that has a gradient in an amount of cross-linking is responsive to an environmental stimulus to change an amount of curvature. The environmental stimulus can be, but is not limited to, drying, exposure to water or exposure to an organic solvent, for example.

The curved, folded or reconfigurable structure can include additional structures. For example, the curved, folded or reconfigurable structure can further include a flexible substrate attached to the curved, folded or reconfigurable polymer film. The substrate can be a single layer of material in some embodiment, or can be a composite structure, for example, having two or more layers. The flexible substrate and the curved, folded or reconfigurable polymer film can define a microfluidic channel therebetween such that the curved, folded or reconfigurable structure is a curved, folded or reconfigurable microfluidic structure according to an embodiment of the current invention. In some embodiments, the flexible substrate and the curved, folded or reconfigurable polymer film define a plurality of microfluidic channels therebetween such that the curved, folded or reconfigurable structure is a scaffold for tissue growth. The flexible substrate and the curved, folded or reconfigurable polymer film can consist essentially of biodegradable materials according to some embodiments of the current invention for applications in which it is desirable for the entire structure to degrade over time. However, the broad concepts of the current invention are not limited to this example.

The curved, folded or reconfigurable structure can further include a pattern of at least one material formed on the curved, folded or reconfigurable polymer film to impart desirable optical and/or electrical functions or properties. For example, materials can be attached to the curved, folded or reconfigurable polymer film to modify optical reflection, transmission, absorption, and/or scattering for example. For example, this could cause a curved, folded or reconfigurable polymer film to appear to change color in response to an environmental stimulus. For example, exposure to moisture or water could cause such a curved, folded or reconfigurable polymer film to change color.

In another example, the curved, folded or reconfigurable structure can be a reconfigurable antenna array. In a further example, the curved, folded or reconfigurable structure can be a metamaterial that provides a negative refractive index. These are only a few examples of possible applications. The particular examples are not intended to limit the scope of the broad concepts of this invention.

The following describes some of the above-mentioned and further examples in more detail. However, the broad concepts of the current invention are not intended to be limited to only these examples.

According to some exemplar embodiments of the current invention, we show how microfluidic networks can be self-assembled by integrating them with a differentially crosslinked and conditioned polymeric film. The exemplar self-assembled devices are comprised of materials widely utilized in conventional microfluidics, namely polydimethylsiloxane (PDMS) and SU-8. While stresses in SU-8 films are often undesirable (Feng, R. and Farris, R. J. Influence of processing conditions on the thermal and mechanical properties of SU8 negative photoresist coatings. *J. Micromech. Microeng.* 13, 80-88 (2003); Sameoto, D., Tsang, S.-H., Foulds, I. G., Lee, S.-W. and Parameswaran, M., Control of the out-of-plane curvature in SU-8 complaint microstructures by exposure dose and baking times. *J. Micromech. Microeng.* 17, 1093-1098 (2007); Keller, S., Blagoi, G., Lillemose, M., Haefliger, D., and Boisen, A. Processing of thin SU-8 films. *J. Micromech. Microeng.* 18, 125020 (2008)), we developed a strategy to create a photopatternable stress gradient in these films so that the films reversibly and reproducibly curved on solvent exchange between water and acetone according to an embodiment of the current invention. The extent and directionality of curvature was controlled by varying the UV exposure energy and direction. We could curve rectangular SU-8 structures with radii of curvature as small as 80 μm and with bidirectional curvature. We also developed a multi-layer patterning scheme to integrate PDMS-based microfluidic networks with these SU-8 films and realize the self-assembly of curved microfluidic networks according to an embodiment of the current invention. However, the broad concepts of the current invention are not limited to these particular examples.

EXAMPLES

Self-Assembly Mechanism

In this example, we created heterogeneous SU-8 films with crosslink gradients (CLGs) along their thickness. SU-8 is a negative photoresist; crosslinking occurs via acid-initiated cationic polymerization on exposure to ultraviolet (UV) light and subsequent heating (Keller, S., Blagoi, G., Lillemose, M., Haefliger, D., and Boisen, A. Processing of thin SU-8 films. *J. Micromech. Microeng.* 18, 125020 (2008); LaBianca, N. C. and Gelorme, J. D. High-aspect-ratio resist for thick-film applications. *Proc. SPIE.* 2438, 846-852 (1995)). The extent of crosslinking within an SU-8 film can be varied by controlling the magnitude of UV exposure energy (Feng, R. and Farris, R. J. Influence of processing conditions on the thermal and mechanical properties of SU8 negative photoresist coatings. *J. Micromech. Microeng.* 13, 80-88 (2003); Sameoto, D., Tsang, S.-H., Foulds, I. G., Lee, S.-W. and Parameswaran, M., Control of the out-of-plane curvature in SU-8 complaint microstructures by exposure dose and baking times. *J. Micromech. Microeng.* 17, 1093-1098 (2007); Keller, S., Blagoi, G., Lillemose, M., Haefliger, D., and Boisen, A. Processing of thin SU-8 films. *J. Micromech. Microeng.* 18, 125020 (2008)). We created CLGs via low-exposure of SU-8 films to a mercury UV lamp using a commercial mask aligner without the use of optical filters that would attenuate wavelengths below 350 nm; SU-8 absorption is significant at these wavelengths (FIG. 2). This method of UV illumination resulted in progressively less exposure along the thickness of the films that caused CLGs upon film baking.

After exposure and baking, the photopatterned films were developed, released from the substrate, and soaked in organic solvents such as acetone to condition the films and generate a stress gradient for self-assembly. The conditioning step removed residual un-crosslinked material which was verified by comparing the dry weights of SU-8 films before and after conditioning. We found that low-exposed SU-8 films showed a 10% decrease in weight whereas high-exposed films showed only a 1% decrease after conditioning (FIG. 3). These differentially photo-crosslinked and acetone-conditioned SU-8 films then spontaneously and reversibly curved upon de-solvation by drying or the addition of water, and flattened when re-solvated by organic solvents. We attribute the spontaneous curving to a stress ($\sigma$) gradient formed across the thickness (d) of the films, arising from the CLGs and conditioning (FIG. 1a). SU-8 is hydrophobic and was solvated in acetone and de-solvated upon drying or by the addition of water to the acetone bath. De-solvation caused a larger contraction of the lesser-crosslinked portion of the film relative to the higher-crosslinked portion, which caused the film to curve such that the lesser-crosslinked part was concave (FIG. 1b). On re-solvation in acetone, the stress gradients were relieved and the film flattened (FIG. 1c). The process was reversible and micropatterned SU-8 films, such as an array of flower-shaped structures anchored to a glass substrate, opened and closed en masse (FIG. 1d). We verified reversibility of SU-8 film curving over 100 cycles and the difference (hysteresis) in the radius of curvature between the first and $100^{th}$ cycles was less than 12%.

We visually confirmed the formation of CLGs by fluorescence imaging of ultramicrotomed cross-sections of conditioned SU-8 films. The autofluorescence characteristic of SU-8 caused the high-crosslinked regions to fluoresce brighter than the low-crosslinked regions. Relative fluorescence intensity line plots indicated that low-exposure films exhibited a CLG whereas high-exposure films exhibited a nearly flat relative fluorescence intensity plot (FIG. 4a). FTIR spectra indicated that low-exposed SU-8 films had higher fractions of epoxy groups and lower fractions of ether groups as compared to high-exposed films, confirming a lesser extent of crosslinking (Keller, S., Blagoi, G., Lillemose, M., Haefliger, D., and Boisen, A. Processing of thin SU-8 films. *J. Micromech. Microeng.* 18, 125020 (2008); Tan, T. L., Wong, D., Lee, P., Rawat, R. S., and Patran, A. Study of a chemically amplified resist for x-ray lithography by Fourier transform infrared spectroscopy. *Appl. Spectrosc.* 58, 1288-1294 (2004)) (see FIG. 5). FTIR spectra also indicated that the chemical structure of SU-8 before and after acetone conditioning was essentially retained, but that the photoinitiator was removed by the solvent (Dektar, J. L. and Hacker, N. P. Photochemistry of triarylsulfonium salts. *J. Am. Chem. Soc.* 112, 6004-6015 (1990)). This removal was larger for low-exposure films and increased as the acetone conditioning time was increased (see FIG. 6).

Factors Affecting Radii of Curvature

We observed that the radii of curvature of conditioned SU-8 films were dependent on several controllable processing parameters: UV exposure energy, film thickness, film aspect ratio, and post exposure bake temperature. Using a Taguchi Design of Experiments (DOE) (Taguchi, G. and Yokoyama, Y. *Taguchi methods: design of experiments* (ASI Press, Dearborn, 1993)), we found that UV exposure energy and film thickness most strongly affected the curvature, accounting for 76.5% of the contribution (FIG. 7). We then systematically varied the film thicknesses and exposure energies of micrometer-thick rectangular beams and measured the resulting radii of curvature after conditioning and de-solvation. The radius of curvature was found to monotonically increase as the exposure energy and film thickness were increased (FIG. 4*b*). These observations are in qualitative agreement with an optical absorption and beam mechanics model which suggests that the radius of curvature should be inversely proportional to the CLG. Details of the model can be found below. As described in the model, since the CLG decreases with increasing exposure energy and increasing film thickness, the radius of curvature increases accordingly.

Versatility in Self-Assembling Geometries

Since the formation of CLGs was found to be UV exposure dependent, conventional photolithography afforded considerable versatility in the self-assembled 3D geometries that could be generated from initially planar templates. Through the use of multiple photomasks to differentially photo-crosslink SU-8 films from above and below, it was possible to create 3D structures with interconnected segments that either remained flat (high-exposure) or curved (low-exposure) in either direction. FIG. 8*a*-8*c* highlights several curved or folded geometries formed in this manner: a cylindrical mesh with a uniform radius of curvature (FIG. 8*a*), cubes with flat faces and unidirectionally curved hinges (FIG. 8*b*), and a sheet with flat faces and bidirectional folds (FIG. 8*c*). Detailed process schematics of the aforementioned geometries (FIG. 1*d*, FIG. 8*a*-8*c*) are presented in FIGS. 9-12.

Another significant advantage of this self-assembly strategy is that it is compatible with multilayer planar fabrication so that dissimilar materials, such as metals or semiconductors, can be incorporated within the differentially crosslinked SU-8 films. For example, using an additional lift-off metallization step and the same bidirectionally folded geometry shown in FIG. 8*c*, gold split ring resonators (SRRs) were patterned atop each of the square faces to create a reconfigurable metamaterial. A noteworthy feature of this metamaterial is that it could be reversibly folded and un-folded so that SRRs were either all periodically arrayed in the same plane (flat state; FIG. 8*e*) or along each of the three (x, y, and z) axes (folded state; FIG. 8*f*). Periodic three-axis SRRs patterned within dielectric media are important optical metamaterials and are very challenging to fabricate (Burckel, D. B., et al. Micrometer-scale cubic unit cell 3D metamaterial layers. *Adv. Mater.* 22, 5053-5057 (2010)). Our self-assembly strategy also enables these materials to be reconfigured upon de-solvation and re-solvation, thereby offering the possibility to create stimuli-responsive 3D metamaterials.

Integration of Microfluidic Channels

The SU-8 templates can be used as a support layer to curve thicker polymeric films and thus enables self-assembling microfluidics. Shown in FIG. 13*a* is a schematic illustrating the concept, whereby a differentially crosslinked SU-8 layer self-assembles PDMS microfluidic channels into curved 3D geometries. The overall thickness of the SU-8/PDMS devices was less than 40 µm, and they were built using planar microfabrication techniques. Multiple devices could therefore be patterned in parallel and with high resolution (for fabrication details see FIG. 14). Briefly, we sandwiched and then later dissolved sacrificial photoresist patterns between two layers of PDMS to define hollow channels. We utilized a highly crosslinked PDMS bottom layer and treated the PDMS interfaces with a low power oxygen plasma to improve adhesion. It was also necessary to optimize the photoresist baking procedure to pattern the sacrificial resist layer without cracking. We defined inlets and outlets into the PDMS channels by using SU-8 as an etch-mask and etching away unwanted PDMS using a dry-etch plasma process (Garra, J., et al. Dry etching of polydimethylsiloxane for microfluidic systems. *J. Vac. Sci. Technol. A* 20, 975-982 (2002)).

In order to self-assemble these microfluidic devices, we released a section of the devices from the underlying silicon (Si) substrate while the inlets and outlets of the device remained attached to the substrate to facilitate a macro-to-micro interface. Upon conditioning and de-solvating the SU-8 layer, PDMS microfluidic devices as long as 3.5 cm (FIG. 13*b*) were self-assembled into cylindrical (FIG. 8*d*, 13*c*, 13*d*) geometries. The macro-to-micro interface allowed for external control of fluid flow via syringe pumps. Flow of fluorescent liquids through the channels was visualized in both single (FIG. 13*e*) and dual (FIG. 13*f*) channel devices. We note that these hybrid SU-8/PDMS microfluidic devices reversibly self-assembled, being curved upon de-solvation and flat upon re-solvation.

Discussion

Differential photo-crosslinking of polymers advances the capabilities of self-assembly by enabling the construction and reversible reconfiguration of complex, 3D micropatterned structures. Our methodology is compatible with planar microfabrication and dissimilar materials, which is important for the self-assembly of curved optoelectronic devices (Kim, R.-H., et al. Waterproof AlInGaP optoelectronics on stretchable substrates with applications in biomedicine and robotics. *Nat. Mater.* 9, 929-937 (2010)) and the practical realization of reconfigurable 3D structural and electromagnetic metamaterials (Zheludev, N. I. A roadmap for metamaterials. *Opt. Photonics News* 22, 30-35 (2011)). Self-assembling SU-8 films were also used to support and spontaneously curve microfluidic networks, thus enabling chemical delivery through micropatterned 3D geometries. Since our methods and materials are compatible with conventional microfluidics, more complex microfluidic networks and modules could be incorporated to extend planar microfluidics to curved, thin film architectures. Another significant highlight of our methodology is that SU-8/PDMS devices are bioinert (Voskericin, G., et al. Biocompatibility and biofouling of MEMS drug delivery devices. *Biomaterials* 24, 1959-1967 (2003); Sia, S. K. and Whitesides, G. M. Microfluidic devices fabricated in poly(dimethylsiloxane) for biological studies. *Electrophoresis.* 24, 3563-3576 (2003); El-Ali, J., Sorger, P. K., and Jensen, K. F. Cells on chips. *Nature.* 442, 403-411 (2006)) and we have verified that our self-assembled microfluidic networks remain curved in cell culture media; hence they are relevant for biological applications. Here, we utilized fluorescent chemicals to visualize our networks as proof-of-concept, but cooling fluids and biochemical nutrients or waste could potentially be transported through these channels to create bio-mimetic self-assembled systems. Moreover, lithographically defined pores could also be incorporated along self-assembled devices to enable local release of chemicals in 3D. Since many hydrogels can be photocrosslinked (Lee, K. Y. and Mooney, D. J. Hydrogels for tissue engineering. *Chem Rev.* 101, 1869-1879 (2001); Nguyen, K. T. and West, J. L. Photopolymerizable hydrogels for tissue engineering applications. *Biomaterials.* 23, 4307-4314 (2002); Choi, N. W., et al. Microfluidic scaffolds for tissue engineering. *Nat. Mater.* 6, 908-915 (2007); Du, Y., Lo, E., Ali, S., and Khademhosseini, A. Directed assembly of cell-laden microgels for fabrication of 3D tissue constructs. *Proc. Natl Acad. Sci. USA* 105, 9522-9527 (2008); Guvendiren, M., Yang, S., and Burdick, J. A. Swelling-induced surface patterns in hydrogels with gradient crosslinking density. *Adv. Funct. Mater.* 19, 3038-3045 (2009)), it may also be possible to extend this concept towards the development of self-assembling microfluidic scaffolds for tissue engineering.

Methods

Substrate preparation. Soda-lime glass [Catalog #48311-720; VWR International] and three inch diameter Si wafers were used as substrates. Substrates were rinsed with deionized (DI) water, acetone, 2-propanol, and then dried with nitrogen ($N_2$) gas before use. Glass substrates allowed for bottom-side UV exposures of SU-8 films. For bottom-side exposures, a chromium (Cr) photomask was deposited onto the glass substrates via a lift-off step. Briefly, a 2.7 µm thick layer of Microposit SC1827 photoresist [Shipley Co.] was photopatterned as per manufacturer's protocol followed, by thermal evaporation of a 150 nm Cr layer at a pressure of approximately $10^{-5}$ Torr. Dissolving the photoresist in acetone resulted in patterned Cr mask layers. Thermal evaporation of a copper (Cu) sacrificial layer atop both glass and Si substrates enabled the release of patterned films upon the selective dissolution of the Cu layer in an aqueous etchant composed of 40% iron (III) chloride hexahydrate [Sigma-Aldrich] and 5% 1N hydrochloric acid (Jamal, M., Bassik, N., Cho, J.-H., Randall, C. L., and Gracias, D. H. Directed growth of fibroblasts into three dimensional micropatterned geometries via self-assembling scaffolds. *Biomaterials* 31, 1683-1690 (2010)). A 30 nm Cu sacrificial layer (with a 5 nm Cr adhesion layer) is semi-transparent and allows for ample UV transmittance for bottom-side UV exposures through glass substrates.

SU-8 photopatterning. SU-8 2000 series photoresist [MicroChem Corp.] was used as received from the manufacturer. Except where specified, SU-8 2015 was spin-coated atop planar substrates at 5000 rpm for 30 sec and soft baked as per manufacturer's protocol, yielding 10.7 µm thick layers. Film thicknesses were measured using a DekTak IIA stylus profilometer [Veeco Instruments, Inc.]. All films were exposed to UV energy using a commercial mask aligner [Ultra Wine Series; Quintel] fitted with a 350 Watt mercury vapor lamp [Catalog #30273; Advanced Radiation Corporation]. Since SU-8 absorbs low-UV wavelengths (see FIG. 2), we exposed SU-8 films without the use of the manufacturer's recommended long pass UV filter. Exposure energy was calculated by multiplying the UV intensity [as measured with a Vari-Wave II, 365 nm sensor; Quintel] by the exposure time. UV intensity was measured through unpatterned substrates (photomask mounts and Cr/Cu-coated glass slides) to compensate for UV attenuation. The films were then post exposure baked as per manufacturer's protocol, developed for 90 sec in SU-8 Developer [MicroChem Corp.] while stirring the solution at 200 rpm, and then rinsed with 2-propanol before drying with $N_2$ gas.

Weight measurements. Dry weight measurements of low (90 mJ/cm$^2$) and high (350 mJ/cm$^2$) UV exposed SU-8 films were taken before and after the films were soaked in acetone or DI water at room temperature for 21 hours (see FIG. 3). The samples were dried in an oven at 100° C. for 15 min prior to weighing with an analytical balance [AB54-S; Mettler Toledo].

Ultramicrotome. SU-8 films were exposed for either low (80 mJ/cm$^2$) or high (300 mJ/cm$^2$) UV energy through a Cr mask to obtain micropatterned 2D sheets (similar to the mesh in FIG. 8a). The sheets were released from the underyling substrate, rinsed with DI water, conditioned in acetone for 30 min, and desolvated upon the addition of DI water. The sheets were then rinsed again with DI water before being pipetted onto paper towels, placed in empty scintillation vials, and covered with embedding resin [Catalog #14120; Electron Microscopy Sciences] prepared by mixing the following: 200 mL Embed 812, 90 mL dodecenyl succinic anhydride, 120 mL methyl-5-norbornene-2,3-dicarboxylic anhydride, and 7 mL Ancaminek 54 curing agent. The resin-covered SU-8 sheets were desiccated overnight, pipetted into a silicone embedding mold, and then baked in an oven for approximately 12 hrs at 60° C. to harden the sectioning capsules. Sections approximately 250 nm in thickness were sliced using a LEICA Ultracut UCT ultramicrotome and placed on glass slides for imaging via fluorescence microscopy to visualize the crosslinking gradients (FIG. 4a).

FT-IR spectroscopy. FTIR spectra of SU-8 films were measured using a Varian 660 Spectrometer with a DTGS detector [Agilent Technologies] and dried/filtered air as the background. The spectra have a resolution of 0.4 cm$^{-1}$ in the 600-4000 cm$^{-1}$ wavenumber region. The average spectrum of 256 scans was obtained using Agilent's Resolutions Pro FTIR software. Prior to FTIR readings, all films were released from the underlying substrate, rinsed with DI water, and dried in air. Spectra were recorded for low (90 mJ/cm$^2$) and high (350 mJ/cm$^2$) UV exposed films before acetone conditioning (see FIG. 5). Films were also conditioned in acetone for 10 min, 3 hrs, or 21 hrs and then rinsed with DI water, dried in air, and then scanned a second time with the same settings (see FIG. 6).

Radius of curvature studies. Taguchi Design of Experiments was implemented using the software Qualitek-4 [Nutek, Inc.]. An L9 array with the following four parameters and three levels were selected: UV exposure energy (150, 250, and 350 mJ/cm$^2$), SU-8 thickness (1, 15, and 30 µm), photopatterned aspect ratio (1:1, 1:6, and 1:30) and post exposure bake temperature (100, 125 and 150° C.). Curvature, which is the reciprocal of SU-8 beam radius of curvature, was used as the response parameter and a "larger the better" criterion was selected for the Taguchi analysis in order to determine which factors increased the curvature. The processing details for each of nine experiments can be found in Table 1. The measured data obtained over 10 trials (samples) for each of the nine experiments can be found in Table 2. The percent contribution of the different factors was calculated using the analysis of variance statistical method as a part of the Taguchi analysis (see FIG. 7). After determining that the two dominant factors were SU-8 thickness and UV exposure energy, radius of curvature was experimentally determined for SU-8 films of varying thickness (approximately 1 µm to 50 µm) that were photopatterned using varying UV exposure energies (FIG. 4b; process details can be found in Table 3). The samples were UV exposed through a photomask designed with rectangular patterns of dimensions 1.5 mm×0.15 mm. After dissolving the Cu sacrificial layer, the beams were rinsed twice in DI water, rinsed once in acetone, and conditioned in acetone overnight. Curvature was induced in acetone-conditioned beams by adding DI water to the acetone (1:1 v/v). The radii of curvature were measured via bright field microscopy.

TABLE 1

Processing parameters for the nine Taguchi experiments.

| TDOE Exp. # | PEB (° C.) | UV exposure energy (mJ/cm$^2$) | Thickness (μm) | Aspect ratio |
|---|---|---|---|---|
| 1 | 100 | 150 | 1 | 1:1 |
| 2 | 100 | 250 | 15 | 1:6 |
| 3 | 100 | 350 | 30 | 1:30 |
| 4 | 125 | 150 | 15 | 1:30 |
| 5 | 125 | 250 | 30 | 1:1 |
| 6 | 125 | 350 | 1 | 1:6 |
| 7 | 150 | 150 | 30 | 1:6 |
| 8 | 150 | 250 | 1 | 1:30 |
| 9 | 150 | 350 | 15 | 1:1 | using a single top-side UV exposure (120 mJ/cm$^2$) through a 2D mask that defined the mesh pattern. The cubes (FIG. 8b) were photopatterned using two top-side exposures: a high exposure (350 mJ/cm$^2$) through a mask defining the square faces, and a low exposure (90 mJ/cm$^2$) through an "overlay" mask that combined both the square faces and the curved hinges. After baking and developing the first layer of the cube template, a second layer of 10.7 μm thick SU-8 was photopatterned (350 mJ/cm$^2$) atop the square faces to make them more rigid. The pattern for the bidirectional sheet (FIG. 8c, 8e, 8f) was adapted from prior literature (Nojima, T. and Saito, K. Development of newly designed ultra-light core structures. *JSME Int* 1, Ser. A, 49, 38-42 (2006); Bassik, N., Stern, G. M., and Gracias, D. H. Microassembly based on hands free origami with bidirectional curvature. *Appl. Phys. Lett.* 95, 091901 (2009)). Here, we UV exposed a single layer of SU-8 three times: once through a photomask defining the square faces (350 mJ/cm$^2$) from above, a second time through an overlay mask defining both the square faces and mountain folds (90 mJ/cm$^2$) from above, and a third time through the Cr-patterned glass substrate and Cu sacrificial layer from

TABLE 2

Raw and average curvature data obtained in units of mm$^{-1}$ obtained from 10 trials for each of the nine Taguchi experiments.

| Exp # | Trial 1 | Trial 2 | Trial 3 | Trial 4 | Trial 5 | Trial 6 | Trial 7 | Trial 8 | Trial 9 | Trial 10 | Avg. | S/N ratio |
|---|---|---|---|---|---|---|---|---|---|---|---|---|
| 1 | 17.53 | 12.80 | 16.46 | 13.61 | 19.86 | 16.14 | 16.24 | 17.83 | 16.21 | 15.81 | 16.25 | 24.03 |
| 2 | 3.62 | 3.74 | 3.70 | 3.30 | 3.16 | 2.77 | 2.65 | 2.63 | 2.59 | 2.56 | 3.07 | 9.46 |
| 3 | 0.91 | 0.92 | 0.94 | 0.94 | 0.94 | 1.06 | 1.03 | 0.95 | 0.94 | 0.93 | 0.96 | −0.42 |
| 4 | 2.38 | 2.37 | 2.29 | 2.29 | 2.30 | 2.48 | 2.24 | 2.37 | 2.30 | 2.38 | 2.34 | 7.35 |
| 5 | 1.82 | 1.81 | 1.66 | 1.74 | 1.59 | 1.80 | 1.77 | 1.62 | 1.75 | 1.73 | 1.73 | 4.73 |
| 6 | 1.12 | 0.90 | 1.82 | 0.83 | 0.94 | 0.92 | 1.66 | 1.37 | 0.77 | 1.27 | 1.16 | 0.31 |
| 7 | 1.07 | 1.07 | 1.05 | 0.94 | 1.03 | 1.12 | 1.05 | 1.04 | 0.94 | 1.06 | 1.04 | 0.28 |
| 8 | 9.17 | 11.31 | 19.53 | 18.28 | 14.92 | 18.51 | 11.80 | 10.43 | 15.46 | 15.25 | 14.47 | 22.40 |
| 9 | 1.25 | 1.30 | 1.27 | 1.43 | 1.44 | 1.41 | 1.30 | 1.25 | 1.26 | 1.32 | 1.32 | 2.39 |

TABLE 3

Processing parameters for SU-8 films of varying thickness. The exposure energies noted in this table represent the range for manufacturer's recommended exposures (SU-8 2000 Permanent Epoxy Negative Photoresist Process Guidelines For: SU-8 2000.5, SU-8 2002, SU-8 2005, SU-8 2007, SU-8 2010 and SU-8 2015 (Ver. 4.0) [Online]. Available: http://www.microchem.com/pdf/SU-82000DataSheet2000_5thru2015Ver4.pdf; SU-8 2000 Permanent Epoxy Negative Photoresist Processing Guidelines For: SU-8 2025, SU-8 2035, SU-8 2050 and SU-8 2075 (Ver. 4.0) [Online]. Available: http://www.microchem.com/products/pdf/SU-82000DataSheet2025thru2075Ver4.pdf) for films photopatterned atop Cu substrates.

| Film thickness (μm) | SU-8 type | Spin speed (rpm) | Spin ramp duration (sec) | Spin duration (sec) | Soft bake time (min) 75:100:75° C. | Manufacturer's suggested exposure energy (mJ/cm$^2$) | PEB time (min) 75:100:75° C. | Development time (min) |
|---|---|---|---|---|---|---|---|---|
| 1.1 | 2000.5 | 300 | 5 | 30 | 1:1:1 | 102-136 | 1:1:1 | 1.00 |
| 10.7 | 2015 | 5000 | 5 | 30 | 1:3:1 | 189-251 | 1:3:1 | 1.50 |
| 14.3 | 2015 | 3250 | 5 | 30 | 1:3:1 | 207-275 | 1:4:1 | 1.75 |
| 24.0 | 2015 | 1430 | 5 | 30 | 1:4:1 | 223-298 | 1:5:1 | 3.00 |
| 39.0 | 2025 | 2040 | 5 | 30 | 2:6:2 | 239-319 | 1:6:1 | 4.50 |
| 50.8 | 2025 | 1440 | 5 | 30 | 3:9:3 | 241-322 | 2:6:2 | 5.00 |

Self-assembly of SU-8 geometries. Detailed process schematics for each of the self-assembled SU-8 geometries in the examples presented here are illustrated schematically in FIGS. 9-12. SU-8 2015 (10.7 μm thick) was used for each geometry. Briefly, the cylinder (FIG. 8a) was photopatterned below (90 mJ/cm$^2$). Lastly, the flower array (FIG. 1d) was patterned using two UV exposures: one bottom-side exposure (120 mJ/cm$^2$) to enable the flower petals to curve away from the glass substrate during self-assembly, and a second top-side exposure (350 mJ/cm$^2$) to strongly crosslink the center of the flower. Additionally, the sacrificial layer was patterned via a lift-off step so that the flower petals could be released while the center of each flower remained anchored to the substrate.

Self-assembly of microfluidic devices. For a detailed process schematic and fabrication protocol, see FIG. 14. Briefly, self-assembled microfluidic devices were fabricated by sandwiching photopatterned sacrificial photoresist channels (SC1827) between spin-coated PDMS [Sylgard 184 Silicone Elastomer Kit; Dow Corning] layers. The overall planar geometry of each self-assembled device was defined by an SU-8 layer that was photopatterned atop the PDMS; bare PDMS around the devices and atop the inlets/outlets was removed via dry-etching (Garra, J., et al. Dry etching of polydimethylsiloxane for microfluidic systems. *J. Vac. Sci. Technol. A* 20, 975-982 (2002)). The SU-8 layer was patterned in registry with underlying layers. Dissolution of the Cu sacrificial layer enabled the release of the self-assembled region of the device while the base of the device (inlets/outlets) remained attached to the Si substrate to facilitate macro-to-micro interfacing. An acetone soak was used to condition the SU-8 layer and to clear the photoresist channels. Devices were self-assembled upon SU-8 de-solvation, and macro-to-micro connectors were subsequently attached.

Optical Absorption and Beam Mechanics Model Relating UV Exposure to Radius of Curvature The following assumptions are intended to simplify the analysis while providing insight. However, the concepts of the invention are not intended to be limited by the correctness or validity of the models. SU-8 photo-polymerization occurs via acid-initiated cationic polymerization on exposure to UV light. At low exposures, we assume that we are within the energy range where the extent of crosslinking increases linearly with exposure energy (Feng, R. and Farris, R. J. Influence of processing conditions on the thermal and mechanical properties of SU8 negative photoresist coatings. *J. Micromech. Microeng.* 13, 80-88 (2003)). At high exposures, the extent of cross-linking becomes much less dependent on variations in exposure energies as SU-8 films approach complete crosslinking.

We exposed SU-8 films to UV light using a standard mercury lamp in a commercial mask aligner. In our model, we assume that the substrate over which the SU-8 is deposited is non-reflective so that we can ignore back-illumination from the substrate. We note that the optical absorption of SU-8 is significant at wavelengths shorter than approximately 350 nm (FIG. 2). Due to this absorption, the manufacturer recommends the use of an optical filter to cut-off wavelengths below 350 nm during exposure to achieve more uniform SU-8 crosslinking and to enable the patterning of SU-8 structures with straight side-walls (SU-8 2000 Permanent Epoxy Negative Photoresist Process Guidelines For: SU-8 2000.5, SU-8 2002, SU-8 2005, SU-8 2007, SU-8 2010 and SU-8 2015 (Ver. 4.0) [Online]. Available: http://www.microchem.com/pdf/SU-82000DataSheet2000_5thru2015Ver4.pdf; SU-8 2000 Permanent Epoxy Negative Photoresist Processing Guidelines For: SU-8 2025, SU-8 2035, SU-8 2050 and SU-8 2075 (Ver. 4.0) [Online]. Available: http://www.microchem.com/products/pdf/SU-82000DataSheet2025thru2075Ver4.pdf). It is important to note that we used the multi-band exposure of a mercury UV lamp without the use of filters; hence, we have significant absorption along the thickness of the exposed film at low UV wavelengths. This absorption causes the light intensity at these low wavelengths to decay along the thickness of the film and is pronounced for low-exposed films.

Using the exponential decay of light through an absorbing medium we can write, $$I_{Bottom} = I_{Top} \exp(-\alpha d) \Rightarrow I_{Top} - I_{Bottom} = I_{Top}[1 - \exp(-\alpha d)] \quad (1)$$

where $I_{Bottom}$ and $I_{Top}$ are the intensities of light at the bottom and top sides of the film, $\alpha$ is a constant which depends on the optical absorptivity or attenuation characteristics of SU-8 at a particular wavelength, and d is the thickness of the film.

Due to significant absorption of SU-8 below 350 nm, on low-exposures and in the absence of a filter that would attenuate low wavelength UV absorption, the top part of the film gets exposed more and consequently more crosslinked than the bottom upon post exposure baking of the film. Thus, a crosslink gradient (CLG) develops. The dependence of this CLG on film thickness and absorptivity can be written as, $$CLG = \frac{CL_{Top} - CL_{Bottom}}{d} \propto \frac{E_{Top} - E_{Bottom}}{d} \propto E_{Top} \frac{[1 - \exp(-\alpha d)]}{d}, \quad (2)$$

so that, $$CLG \propto E_{Top} \frac{[1 - \exp(-\alpha d)]}{d}, \quad (3)$$

where CL is the extent of crosslinking and E is the exposure energy. It should be noted that since we are exposing the films with multi-band exposure, and the absorptivity/photo-crosslinking of SU-8 varies at different wavelengths, it is a first order approximation intended to provide insight into the mechanism. Moreover, this expression is valid only when there is a linear dependence of photo-crosslinking on exposure energies (Feng, R. and Farris, R. J. Influence of processing conditions on the thermal and mechanical properties of SU8 negative photoresist coatings. *J. Micromech. Microeng.* 13, 80-88 (2003)) which we refer to as low-exposure energies.

From equation (3), we see that at low exposures, the CLG decreases with increasing film thickness, the extent of which depends on the absorptivity. This expression can also be used for other materials and the magnitude of the CLG can be manipulated by altering the film thickness and by using exposures at different wavelengths where the absorptivity varies.

We note that differentially crosslinked films remained flat on release from the substrate. On conditioning the films in acetone, un-crosslinked material is removed resulting in a stress gradient that causes the SU-8 structures to curve on de-solvation. On re-solvation, the gradient is homogenized and the structures flatten out. We characterized the radius of curvature (plotted in FIG. 4b) using rectangular beams of 1.5 mm length, 0.15 mm width and a thickness d ranging from approximately 1 micrometer to 50 micrometers. We note that these structures were rectangular and the thicknesses of the films was much smaller than their lengths (d<<L). Thus, we can utilize rectangular beam bending mechanics (Gere, J. M. and Timoshenko, S. P., *Mechanics of Materials* $4^{th}$ Ed. Boston: PWS Pub. Co., 1997; Rebeiz, G. M., *RF MEMS: Theory, Design, and Technology.* New Jersey: John Wiley & Sons, 2003; Chinthakindi, A. K. and Kohl, P. A., Electrostatic actuators with intrinsic stress gradient. *J. Electrochem. Soc.*, 149, H146-H152 (2002)) to relate the radius of curvature R to the stress gradient Γ;

$$R \propto \frac{1}{\Gamma}. \quad (4)$$

Since the stress gradient is derived from the removal of un-crosslinked material from films with a CLG, and the extent of removal is dependent on the extent of crosslinking, we assume that the stress gradient increases with increasing CLG. This assumption is corroborated by all experiments in the examples. The exact relationship between the stress gradient and the CLG depends on other processing factors too, such as acetone conditioning time. Assuming a linear dependence, $$\Gamma \propto CLG \quad (5),$$

we get a relationship between the radius of curvature and the CLG as, $$R \propto \frac{1}{CLG}, \quad (6)$$

which allows us to explain the trends observed in FIG. 4b. For example, we see that for the same exposure energy, the radius of curvature increases with increasing thickness. This observation is validated from the model since it follows from equation (3) that an increased thickness d, decreases the CLG and from equation (6) that this decreased CLG will result in an increased radius of curvature. Assuming a Young's modulus for SU-8 of 2 GPa and a Poisson's ratio of 0.2, we can estimate the magnitude of the stress gradient to be in the range of 1-32 MPa/μm depending on the thickness of the film.

Self-Assembling Microfluidic Device Fabrication (FIGS. 8d, 13)

This section describes the fabrication details of the microfluidic devices shown in FIGS. 8d, 13 (see also FIG. 14 for a detailed schematic). We note that prior to all UV exposure steps, the UV intensity was measured through a bare glass photomask mount to determine the required exposure times. We also note that all bake steps were carried out using aluminum foil-covered hot plates with the substrate temperature checked using a handheld infrared thermometer.

First, a 3 inch diameter silicon (Si) wafer was cleaned with DI water, acetone, 2-propanol, and then dried with nitrogen ($N_2$) gas. A copper (Cu) sacrificial layer was then patterned via lift-off metallization. Briefly, a 2.7 μm thick layer of SC1827 photoresist (PR) was deposited and photopatterned as per manufacturer's protocol. Thermal evaporation of 15 nm/90 nm chromium/Cu and subsequent dissolution of the photoresist in acetone resulted in the patterned Cu sacrificial regions.

Next, a layer of polydimethylsiloxane (PDMS) [Sylgard 184 Silicone Elastomer Kit; Dow Corning] was deposited atop the wafer after the PDMS had been mixed and degassed. PDMS of a 1:3 curing agent-to-base weight ratio was deposited by spin-coating (2.5 mL at 2500 rpm for 45 sec) and was baked at 100° C. for 2 hrs with a 300° C./hr ramp up and 1 hr ramp down to room temperature, yielding a 12 μm thick layer. The Si wafer was dehydration baked at 150° C. for 5 minutes immediately prior to depositing the PDMS. We note that a 1:3 curing agent-to-base weight ratio was used for the first PDMS layer since the sacrificial PR channel layer was susceptible to cracking when baked atop less crosslinked PDMS, likely due to the mismatch in thermal expansion coefficients between PR and less crosslinked PDMS.

After baking, the 1:3 PDMS layer was then oxygen ($O_2$) plasma cleaned [75 W for 90 sec at 0.300 Ton; Technics PEII-A, 30 kHz RF power]. A 10 μm thick PR layer, later patterned into sacrificial microfluidic channels, was immediately spin-coated (2.5 mL spun at 500 rpm for 1 min) and baked with a procedure we developed that largely eliminated cracking of the PR. Specifically, the wafer was exchanged between a 144° C. hotplate for 20 sec and an 88° C. hotplate for 20 sec. This exchange was repeated five times in succession, after which the wafer was gradually cooled to room temperature over 1 hr. The PR layer was then exposed (360 mJ/cm$^2$) in registry with the sacrificial Cu layer and with the photomask in soft contact with the film (all subsequent UV exposures were performed in hard contact). The PR was then developed for 90 sec with gentle agitation in a bath of 1:5 volume ratio of developer [Microposit 351 Developer; MicroChem Corp.] to DI water, rinsed with DI water and dried with $N_2$ gas. A foam swab was wet with acetone and gently rubbed along the outer edge of the PDMS side of the wafer to remove the remaining photoresist edgebead.

Next, 1:5 PDMS was degassed, spin-coated (2.5 mL at 2500 rpm) and baked at 85° C. for 4 hrs with a 300° C./hr ramp up, followed by a 1 hr ramp down to room temperature, resulting in a 18 μm thick top PDMS layer. This bake was carried out at a lower temperature and longer duration than the previously deposited 1:3 layer in order to sufficiently cure the top PDMS layer yet prevent the underlying PR layer from cracking. We also note that a 1:5 ratio was used for the top PDMS layer since subsequently deposited photoresist materials are not as susceptible to cracking due to thermal expansion of PDMS.

After baking the top PDMS layer, a 25 μm thick layer of SU-8 2015 was patterned in registry with the underlying layers. Briefly, the wafer was first plasma cleaned as before. Next, 2.5 mL of SU-8 2015 was immediately spin-coated at 1600 rpm for 38 sec, soft baked on a hot plate set at 40° C. with a 300° C./hr ramp and 15 min hold at 85° C., and then gradually cooled to room temperature over 1 hr. The SU-8 layer was exposed (350 mJ/cm$^2$) and post exposure baked on a room temperature hotplate ramped to 85° C. at 300° C./hr, then immediately set to gradually cool to room temperature over 1 hr. The wafer was developed in SU-8 Developer while stirring at 200 rpm. SU-8 Developer can diffuse through PDMS; hence, prolonged and continuous developments caused the sacrificial PR embedded within the PDMS layers to reflow. Developments were therefore carried out in 30 sec immersions, followed by drying with $N_2$ gas over 30 sec. The immersion/drying cycle was repeated five times for an overall immersion duration of 2.5 min, after which the wafer was briefly rinsed with acetone and 2-propanol before being dried with $N_2$ gas.

The unwanted regions of PDMS were removed via a dry-etch step with $O_2$ and carbon tetrafluoride ($CF_4$). These regions included macro-to-micro inlets/outlets for pumping fluids through the devices. The previously patterned SU-8 layer served as both a stress layer for the self-assembling region of the device, and as an etch mask at the inlet/outlet region of the device that remains on the Si substrate ("base of the device"). An NR4-8000P resist layer [Futurrex, Inc.] served as a second etch mask, atop the SU-8 self-assembling region only. Briefly, the wafer was plasma cleaned as before and 2.5 mL of NR4-8000P was immediately spin-coated at 3500 rpm for 40 sec. The wafer was soft baked using a similar procedure as for the sacrificial PR channel layer, but the temperatures were 144° C./91° C. with a total resting time of 90 sec at 144° C. This process yielded an 8 μm thick layer of NR4-8000P. Next, the NR4 layer was UV exposed (3000 mJ/cm$^2$ as measured with a 405 rim wavelength sensor), and then post exposure baked at 85° C. for 5 min with a 300° C./hr ramp up followed by a 1 hr ramp down to room temperature. The resist was developed in an RD-6 bath [Futurrex, Inc.] for 195 sec, rinsed with DI water, and dried with N$_2$ gas. The wafer was then dry-etched using a planar etcher [270 W, 15 sccm CF$_4$, 5 sccm O$_2$, and a chamber pressure of 0.250 Torr; PE-100 etcher; Plasma Etch, Inc]. The observed etch rates were approximately 22 μm/hr for PDMS and 15 μm/hr for SU-8/NR4. We conducted preliminary tests using a Technics PEII-A, 30 kHz RF power planar etcher at 300 W with the same gas ratio and measured etch rates of 15 μm/hr for PDMS and 8 μm/hr for SU-8/NR4. The dry-etch step was carried-out until both the bulk PDMS around each device and the SU-8 etch mask atop the base of the devices were completely removed. Thicknesses were measured using a DekTak IIA stylus profilometer.

After dry-etching, the self-assembling SU-8/PDMS portion of the device was released from the underlying Si wafer by selectively dissolving the Cu sacrificial layer in an aqueous etchant composed of 40% ferric chloride and 5% HCl. Using a diamond tipped scribe, the Si substrate was manually diced to separate each of the simultaneously microfabricated devices and to enable the overhanging of the released SU-8/PDMS portion. Removing the released Si substrates below the SU-8/PDMS portions assured the Si would not physically prevent self-assembly of the devices. Next, the devices were immersed in an acetone bath overnight to both condition the SU-8 stress layers and to dissolve the sacrificial PR layers thereby unblocking the embedded channels. The devices self-assembled upon the addition of DI water to the bath and then were dried in air.

Macro-to-micro interfacing with the thin, self-assembled devices was achieved by manually coring PDMS blocks and attaching them to the microfabricated inlets/outlets at the base of the devices (Mohanty, S. and Beebe, D. J., Chips & Tips: PDMS connectors for macro to microfluidic interfacing. (2006) [Online]. Available: http://www.rsc.org/Publishing/Journals/lc/PDMS_connector.asp). Briefly, 1:10 curing agent-to-base weight ratio PDMS was first poured into a Petri dish and baked at 60° C. for several hours. The PDMS slab was removed and cut into approximately 3 mm by 3 mm by 1 cm blocks, each with a 1 cm long hole punched using a Harris Uni-core puncher to later form tight fits around syringe needles of varying gauge (ex. 0.5 mm punchers for 22 gauge needles). Each connector was placed atop an inlet/outlet using a 3 mm by 3 mm sheet of 50 μm thick double-sided tape [Catalog # SA-S-1L, Grace Bio-Labs] with a 2 mm diameter hole punched through. Once attached to the base of a device, the array of PDMS connecters was surrounded by rigid plastic sides (~15 mm tall), the space around the connectors was filled with 5 minute epoxy, and device fabrication was then complete.

Devices were loaded with fluorescent solutions using a modified vacuum loading protocol (Monahan, J. M., Gewirth, A. A., and Nuzzo, R. G., A method for filling complex polymeric microfluidic devices and arrays. *Anal. Chem.* 73, 3193-3197 (2001)) and with syringe pumps. Although not required for the channel geometries utilized in our manuscript, the pre-filling of complex microfluidic networks with buffer solution can greatly improve device operation by eliminating the trapping of air bubbles that may otherwise disrupt fluid flow. Vacuum loading (FIG. 13) was achieved by first connecting plastic syringes (with their plungers removed) to 22 gauge blunt needles and then inserting the needles into the PDMS connectors. The syringes were then filled with solutions (1 mM fluorescein or 500 μM rhodamine B in ethanol) and the assemblies were placed in a desiccator for 10 min to remove air from the device channels. Upon releasing the vacuum, the fluorescent solutions filled the channels. Submerging the self-assembled regions of the devices in DI water during loading ensured air did not re-enter the devices through the thin PDMS walls upon release of the vacuum, which would have hampered filling of the channels.

Syringe pumps were also independently utilized to infuse solutions into the devices. Solutions were typically pumped using syringes connected to 24 gauge Teflon tubing. A 22 gauge luer lock needle connected to a syringe was typically insert into one end of a Teflon tube, and a 23 gauge stainless steel cylinder [0.025 inch OD, 0.17 inch ID, 1 inch long; Catalog # NE-1300-02, New England Small Tube] was inserted in the other end of the Teflon tube and then to the PDMS connectors of the devices. Needles could be disconnected/reconnected to the macro-to-micro interface without introducing air bubbles if the head volume above the base of the device (formed by the aforementioned ~15 mm plastic sides) was filled with DI water to prevent the trapping of bubbles at the inlets when syringes were subsequently removed or added.

The embodiments illustrated and discussed in this specification are intended only to teach those skilled in the how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A curved, folded or reconfigurable structure comprising:
 a curved, folded or reconfigurable polymer film having at least one portion that has a gradient in an amount of cross-linking of polymer chains along a cross-sectional direction thereof,
 wherein said at least one portion being responsive to an environmental stimulus to change an amount of curvature, and
 wherein said curved, folded or reconfigurable structure is a self-assembling three-dimensional structure of at least one of a microfluidic structure, an electromagnetic structure, and an optoelectronic structure.

2. The curved, folded or reconfigurable structure according to claim 1, wherein said environmental stimulus is at least one of drying or an organic solvent.

3. A curved, folded or reconfigurable structure comprising:
 a curved, folded or reconfigurable polymer film having at least one portion that has a gradient in an amount of cross-linking of polymer chains along a cross-sectional direction thereof; and
 a flexible substrate attached to said curved, folded or reconfigurable polymer film,
 wherein said at least one portion being responsive to an environmental stimulus to change an amount of curvature, and
 wherein said flexible substrate and said curved, folded or reconfigurable polymer film define a microfluidic channel therebetween such that said curved, folded or reconfigurable structure is a curved, folded or reconfigurable microfluidic structure.

4. The curved, folded or reconfigurable structure according to claim 3, wherein said flexible substrate and said curved, folded or reconfigurable polymer film define a plurality of microfluidic channels therebetween such that said curved, folded or reconfigurable structure is a scaffold for tissue growth.

5. The curved, folded or reconfigurable structure according to claim 3, wherein said flexible substrate and said curved, folded or reconfigurable polymer film consist essentially of biodegradable materials.

6. A curved, folded or reconfigurable structure comprising:
a curved, folded or reconfigurable polymer film having at least one portion that has a gradient in an amount of cross-linking of polymer chains along a cross-sectional direction thereof; and
a pattern of at least one material formed on said curved, folded or reconfigurable polymer film,
wherein said at least one portion being responsive to an environmental stimulus change an amount of curvature, and
wherein a reconfiguration of said curved, folded or reconfigurable structure with said at least one material results in at least one of a selectively reconfigurable and controllable optical property of said curved, folded or reconfigurable structure or a selectively reconfigurable and controllable electrical property of said curved, folded or reconfigurable structure.

7. The curved, folded or reconfigurable structure according to claim 6, wherein said reconfiguration of said curved, folded or reconfigurable structure with said at least one material results in a selectively reconfigurable and controllable optical property such that at least one of an optical reflection, transmission, absorption, or scattering property of said curved, folded or reconfigurable structure selectively changes with said reconfiguration.

8. The curved, folded or reconfigurable structure according to claim 6, wherein said at least one material is an electrical conductor and said curved, folded or reconfigurable structure is an antenna array.

9. The curved, folded or reconfigurable structure according to claim 6, wherein said at least one material is an electrical conductor and said curved, folded or reconfigurable structure is a metamaterial.

* * * * *